United States Patent
Wu

(10) Patent No.: US 11,635,857 B2
(45) Date of Patent: Apr. 25, 2023

(54) TOUCH SENSORS FOR INTERACTIVE OBJECTS WITH INPUT SURFACE DIFFERENTIATION

(71) Applicant: Google LLC, Mountain View, CA (US)

(72) Inventor: Tong Wu, Mountain View, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 17/081,322

(22) Filed: Oct. 27, 2020

(65) Prior Publication Data

US 2021/0124443 A1  Apr. 29, 2021

(51) Int. Cl.
| | |
|---|---|
| G06F 3/044 | (2006.01) |
| G06N 20/00 | (2019.01) |
| G06F 3/041 | (2006.01) |
| G06N 3/08 | (2006.01) |
| H03K 17/96 | (2006.01) |
| G06N 3/084 | (2023.01) |

(52) U.S. Cl.
CPC ............ *G06F 3/044* (2013.01); *G06F 3/0416* (2013.01); *G06N 3/084* (2013.01); *G06N 20/00* (2019.01); *H03K 17/962* (2013.01); *G06F 2203/04102* (2013.01)

(58) Field of Classification Search
None
See application file for complete search history.

(56) References Cited

U.S. PATENT DOCUMENTS

| | | | | |
|---|---|---|---|---|
| 2006/0007171 | A1* | 1/2006 | Burdi ................... | H03K 17/962 345/173 |
| 2011/0141045 | A1 | 6/2011 | Choi et al. | |
| 2014/0145998 | A1* | 5/2014 | Liu ...................... | G06F 3/04182 345/174 |
| 2014/0347076 | A1* | 11/2014 | Barton ..................... | H01B 5/00 324/663 |
| 2016/0117003 | A1* | 4/2016 | Chang .................. | G06F 3/04186 345/173 |
| 2016/0216825 | A1 | 7/2016 | Forutanpour | |
| 2017/0075481 | A1* | 3/2017 | Chou ...................... | G06F 1/163 |
| 2017/0083102 | A1* | 3/2017 | Dow ....................... | G06F 3/017 |
| 2017/0196513 | A1* | 7/2017 | Longinotti-Buitoni ...................... | A61B 5/6805 |
| 2017/0325518 | A1* | 11/2017 | Poupyrev .................. | D02G 3/12 |

(Continued)

OTHER PUBLICATIONS

International Search Report and Written Opinion for PCT/US2019/058314, dated Jul. 27, 2020, 11 pages.

*Primary Examiner* — Christopher R Lamb
(74) *Attorney, Agent, or Firm* — Dority & Manning, P.A.

(57) ABSTRACT

A sensor system includes a touch sensor having a plurality of conductive sensing elements integrated with a flexible substrate. A first subset of sensing elements is coupled to a first side of the flexible substrate and a second subset of sensing elements is coupled to a second side of the flexible substrate. The sensor system is configured to obtain touch data associated with a touch input to the touch sensor. The touch data is based at least in part on a respective response to the touch input by the plurality of conductive sensing elements. The sensor system is configured to determine whether the touch input is associated with the first subset of conductive sensing elements or the second subset of conductive sensing elements based at least in part on the respective response to the touch input by the sensing elements.

21 Claims, 16 Drawing Sheets

(56) References Cited

U.S. PATENT DOCUMENTS

2018/0364804 A1* 12/2018 Hoen ................... G06F 3/014
2019/0364983 A1* 12/2019 Nakajima ............ A61B 5/6804
2020/0097109 A1*  3/2020 Cobanoglu ............ D02G 3/441

* cited by examiner

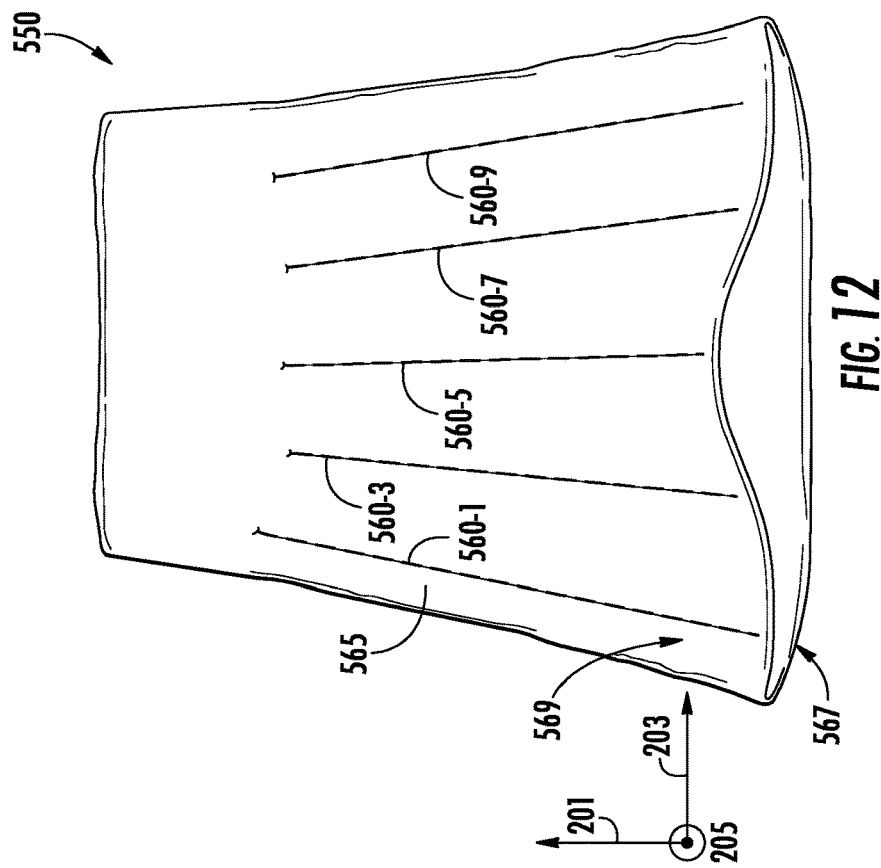
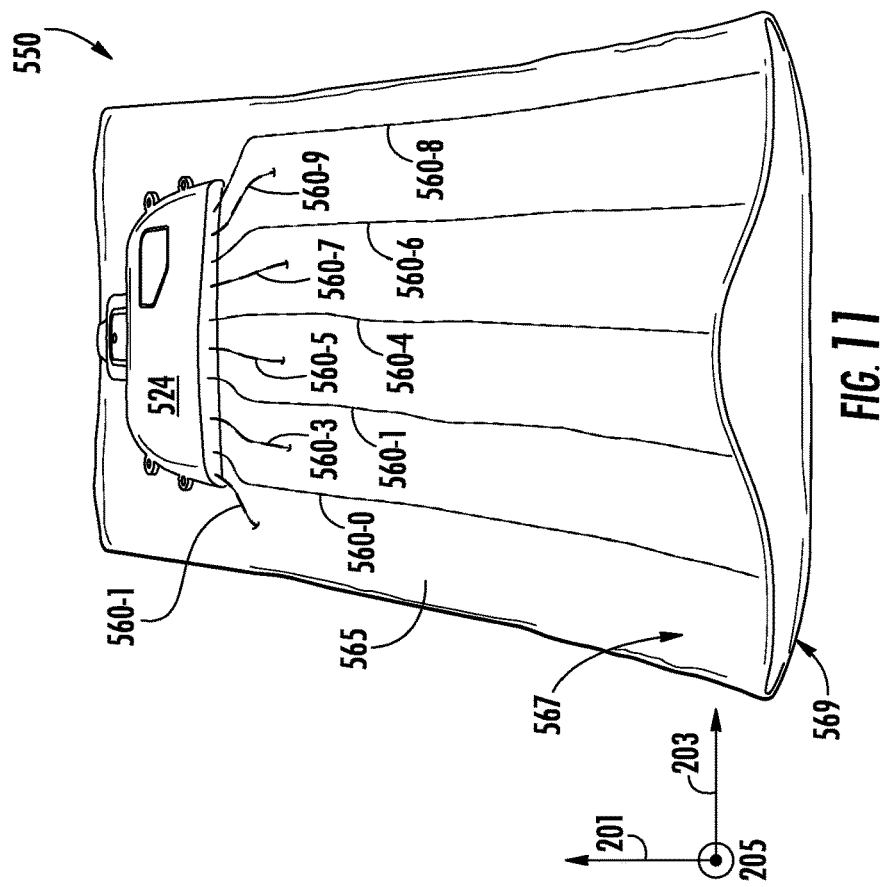

TOUCH SENSORS FOR INTERACTIVE OBJECTS WITH INPUT SURFACE DIFFERENTIATION

PRIORITY CLAIM

The present application is based upon and claims the right of priority to International Application No. PCT/US2019/058314, filed on Oct. 28, 2019, the disclosure of which is hereby incorporated by reference herein in its entirety for all purposes.

FIELD

The present disclosure relates generally to touch sensors for interactive objects.

BACKGROUND

An interactive object can include conductive sensing elements such as conductive threads incorporated into the interactive object to form a sensor such as a capacitive touch sensor that is configured to detect touch input. The interactive object can process the touch input to generate touch data that is useable to initiate functionality locally at the interactive object or at various remote devices that are wirelessly coupled to the interactive object. Interactive objects may include conductive sensing elements for other purposes, such as for strain sensors using conductive threads and for visual interfaces using line optics.

An interactive object may be formed by forming a grid or array of conductive thread woven into an interactive textile, for example. Each conductive thread can include a conductive wire (e.g., a copper wire) that is twisted, braided, or wrapped with one or more flexible threads (e.g., polyester or cotton threads). It may be difficult, however, for traditional sensor designs with such conductive lines to be implemented within objects.

SUMMARY

Aspects and advantages of embodiments of the present disclosure will be set forth in part in the following description, or may be learned from the description, or may be learned through practice of the embodiments.

One example aspect of the present disclosure is directed to a sensor system that includes a touch sensor comprising a plurality of conductive sensing elements integrated with a flexible substrate. The plurality of conductive sensing elements includes a first subset of conductive sensing elements coupled to a first side of the flexible substrate and a second subset of conductive sensing elements coupled to a second side of the flexible substrate. The first side is opposite the second side in a direction orthogonal to first side and the second side. The sensory system includes one or more control circuits configured to obtain touch data associated with a touch input to the touch sensor. The touch data is based at least in part on a respective response to the touch input by the plurality of conductive sensing elements. The one or more control circuits are configured to determine whether the touch input is associated with the first subset of conductive sensing elements or the second subset of conductive sensing elements based at least in part on the respective response to the touch input by the plurality of conductive sensing elements.

Another example aspect of the present disclosure is directed to an interactive object wearable by a user and including a touch sensor including a plurality of parallel sensing lines elongated in a first direction with a separation therebetween in a second direction orthogonal to the first direction. The plurality of parallel sensing lines includes a first subset of parallel sensing lines and a second subset of parallel sensing lines separated in a third direction orthogonal to the first direction and the second direction. The touch sensor includes an input surface configured to receive inputs from the user and a second surface adjacent to at least a portion of the user when the interactive object is worn by the user. The interactive object includes one or more control circuits in communication with the touch sensor. The one or more control circuits are configured to detect a respective response associated with each of the plurality of parallel sensing lines in response to a touch input to the touch sensor and determine whether the touch input is associated with the input surface or the second surface based at least in part on the respective response associated with each of the plurality of parallel sensing lines.

Yet another example aspect of the present disclosure is directed to a computer-implemented method of managing input at an interactive object. The method includes obtaining, by one or more processors, touch data associated with a touch sensor comprising a plurality of parallel sensing lines elongated in a first direction with a separation therebetween in a second direction orthogonal to the first direction. The plurality of parallel sensing lines includes a first subset of parallel sensing lines and a second subset of parallel sensing lines separated in a third direction orthogonal to the first direction and the second direction. The touch sensor includes an input surface configured to receive input from a user and a second surface adjacent to at least a portion of the user when the interactive object is worn by the user. The method includes detecting, by the one or more processors, a respective response associated with each of the plurality of sensing lines in response to a touch input to the touch sensor, and determining, by the one or more processors, whether the touch input is associated with the input surface or the second surface based at least in part on the respective response associated with each of the plurality of sensing lines.

Other example aspects of the present disclosure are directed to systems, apparatus, computer program products (such as tangible, non-transitory computer-readable media but also such as software which is downloadable over a communications network without necessarily being stored in non-transitory form), user interfaces, memory devices, and electronic devices for implementing and utilizing touch sensors such as capacitive touch sensors.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which:

FIGS. 11 and 12 are top and bottom views, respectively, depicting an example of a touch sensor including individual subsets of sensing elements coupled to opposite sides of a flexible substrate with a vertical separation in accordance with example embodiments of the present disclosure;

DETAILED DESCRIPTION

Figure 1:
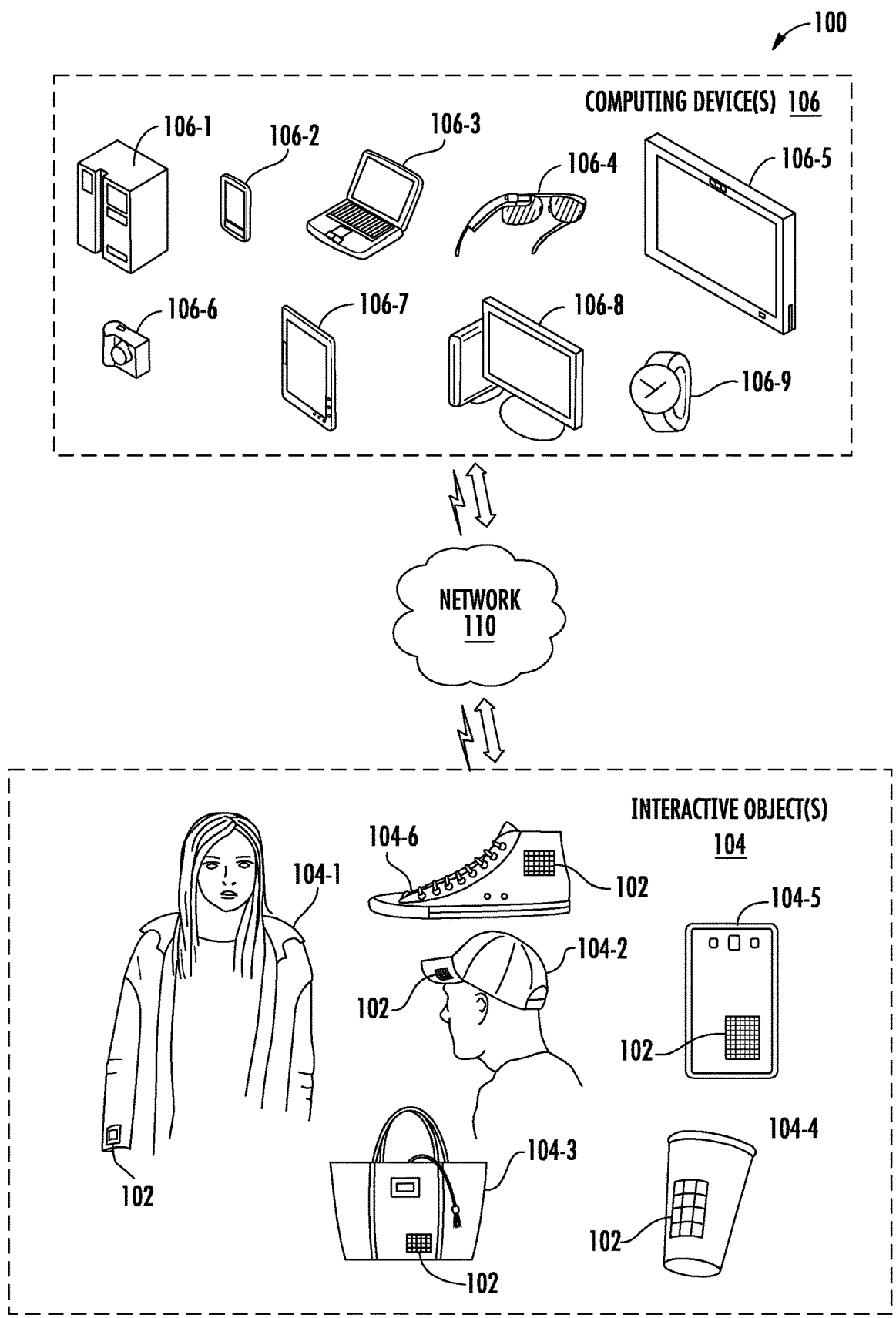
FIG. 1 illustrates an example computing environment including an interactive object having a touch sensor in accordance with example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Generally, the present disclosure is directed to a sensor system including a touch sensor having a set of conductive sensing elements that can be integrated with at least one substrate to form an interactive object that is capable of distinguishing touch inputs received at a first surface of the touch sensor from touch inputs received at a second surface of the touch sensor. By way of example, the touch sensor can be integrated with an interactive object such that intentional touch inputs provided at an intended input surface can be distinguished from inadvertent or unintentional inputs detected at an opposite surface adjacent to the body of a user when the interactive object is worn or otherwise carried by the user. Touch inputs at the different surfaces can be distinguished using a single set of conductive sensing elements, each of which may generate detectable responses (e.g., capacitances or resistances) in response to inputs at both surfaces. In this manner, example embodiments of the disclosed technology can provide an improved capability to distinguish touch inputs detected at different surfaces of a touch sensor. Moreover, in some examples, additional shielding layers that may typically be provided between the body of a user and a touch sensor can be avoided, thereby enabling tighter integration of the touch sensor with interactive objects such as wearable devices.

A touch sensor in example embodiments can include a first subset of conductive sensing elements and a second subset of conductive sensing elements that are separated in a direction orthogonal to the first surface and the second surface of the touch sensor. The sensor system can detect a response (e.g., a resistance or capacitance) of each sensing element of the set in response to a touch input. Based on a respective response of each sensing element, the sensor system can determine whether a touch input is received at the first surface or the second surface. For instance, if at least one response (e.g., capacitance or resistance) of the first subset of sensing elements is greater than at least one respective response of the second subset of sensing elements, the sensor system can classify the touch input as having been received at the first surface of the touch sensor. If the at least one respective response of the second subset of sensing elements is greater than the at least one respective response of the first subset of sensing elements, however, the sensor system can classify the touch input as having been received at the second surface of the touch sensor.

In some examples, the set of conductive sensing elements can be coupled to opposite sides of a flexible substrate, with or without a vertical separation between the subsets of conductive sensing elements. For example, a first subset of conductive sensing elements can be coupled to a first side of the flexible substrate and a second subset of flexible sensing elements can be coupled to a second side of the flexible substrate. The first and second sides can be opposite sides in a direction orthogonal to the first and second surfaces of the touch sensor. In some examples, the first subset of conductive sensing elements and the second subset of conductive sensing elements can be separated by a distance in the direction orthogonal to the first surface and the second surface of the touch sensor. In other examples, however, the first subset of conductive sensing elements and the second subset of sensing elements can be formed in the same plane, without a vertical spacing therebetween. For instance, the flexible substrate can form an S-shaped pattern whereby the substrate separates the subsets of conductive threads without creating a distance between the conductive threads in the vertical direction. Nevertheless, in such embodiments, the flexible substrate can provide shielding between the first subset of conductive threads and the second subset of conductive threads. Touch inputs at the first surface and the second surface can be differentiated with or without having a vertical separation between the subsets of conductive threads. For instance, one or more shielding layers may be formed in the flexible substrate. In some examples, one or more insulating materials may be formed as part of the flexible substrate to provide a shielding layer that includes insulation between the first subset of conductive threads and the second subset of conductive threads. For example, one or more insulating layers having a low dielectric constant can be used. A material may be used that partially but does not fully attenuate the signals generated by the threads opposite a touch input.

In accordance with some implementations, a set of conductive sensing elements can include a set of parallel sensing lines that are elongated in a first direction with a spacing between sensing lines that are adjacent in a second direction orthogonal to the first direction. The set of parallel sensing lines can be non-crossing lines that are elongated in the first direction without overlapping. For example, the non-crossing lines can form a conductive line pattern without intersecting, touching, or crossing underneath or over one another at an intended touch input area of the touch sensor. The set of parallel sensing lines can include a first subset of sensing lines that is separated from a second subset of sensing lines in a third direction that is orthogonal to both the first direction and the second direction. For instance, the set of parallel sensing lines can be elongated in a longitudinal direction with a spacing between the conductive sensing lines that are adjacent in a lateral direction.

The first subset of sensing lines can be separated from the second subset of sensing lines by a distance in a vertical direction that is orthogonal to the lateral and longitudinal directions. For example, the first subset of sensing lines can be formed closer to an intended input surface of the touch sensor and the second subset of sensing lines can be formed further from the intended input surface. For instance, the second subset of sensing lines can be formed closer to a second surface of the touch sensor that is adjacent to the body of a user when a wearable garment or other interactive object including the touch sensor is worn by the user. The distance between the first subset of sensing lines and the second subset of sensing lines can provide a differentiable capacitive output of the touch sensor in response to touch inputs that are received at the intended input surface and the second surface, respectively. In this manner, the touch sensor can differentiate between intentional inputs provided by a user at the intended input surface and unintentional inputs caused by movement of the touch sensor relative to the user's body when the wearable garment is worn by the user.

In example embodiments, a set of conductive sensing lines of a touch sensor can be formed by interleaving a first subset of the conductive sensing lines with a second subset of the conductive sensing lines. For instance, alternating ones of the set of conductive sensing lines can be formed on a first side of a flexible substrate and a second side of the flexible substrate such that the first subset of conductive sensing lines is formed on the first side and the second subset of conductive sensing lines is formed on the second side. In some examples, alternating ones of the set of conductive sensing lines can be formed on the first side and the second side such that an equal number of sensing lines are formed on each surface. In other examples, an unequal number of sensing lines can be formed on each side. The set of flexible conductive sensing lines can form a sequence with a spacing provided between sequential sensing lines that are adjacent in a second direction that is orthogonal to the first direction. The sequence of flexible conductive sensing lines in the second direction can form a subset of even sensing lines (e.g., lines 0, 2, 4, 6, etc.) and a subset of odd sensing lines (e.g., lines 1, 3, 5, 7, etc.).

Any type of conductive line can be used in accordance with example embodiments of the present disclosure. By way of example, a conductive line can include a conductive thread, conductive fiber, fiber optic filaments, flexible metal lines, etc. A conductive thread of an interactive textile may include a conductive core that includes at least one conductive wire and a cover layer constructed from flexible threads that cover the conductive core. The conductive core may be formed by twisting one or more flexible threads (e.g., silk threads, polyester threads, or cotton threads) with the conductive wire, or by wrapping flexible threads around the conductive wire. In some implementations, the conductive core may be formed by braiding the conductive wire with flexible threads (e.g., silk). The cover layer may be formed by wrapping or braiding flexible threads around the conductive core. In some implementations, the conductive thread is implemented with a "double-braided" structure in which the conductive core is formed by braiding flexible threads with a conductive wire, and then braiding flexible threads around the braided conductive core. At least a portion of each conductive thread can be connected to a flexible substrate, such as by weaving, embroidering, gluing, or otherwise attaching the conductive threads to the flexible substrate. In some examples, the conductive threads can be woven with a plurality of non-conductive threads to form the flexible substrate. Other types of conductive lines may be used in accordance with embodiments of the disclosed technology. Although many examples are provided with respect to conductive threads, it will be appreciated that any type of conductive line can be used with the touch sensor according to example embodiments.

By way of example, the set of conductive sensing elements can include a set of conductive threads that are woven or otherwise integrated with a plurality of non-conductive threads to form an interactive textile. More particularly, the conductive threads can be formed on opposite sides of a flexible textile substrate. A first subset of conductive threads can be woven with or otherwise coupled to the first side of the interactive textile and the second subset of conductive threads can be woven with or otherwise coupled to the second side of the interactive textile. The first subset of conductive threads can be formed on a first side adjacent to a first surface of the touch sensor and a second subset of conductive threads can be formed on an opposite side adjacent to a second surface of the touch sensor. A touch input to the touch sensor can be detected by the plurality of sensing lines using sensing circuitry connected to the one or more sensing lines. The sensing circuitry can generate touch data (e.g., raw sensor data or data derived from the raw sensor data) based on the touch input. The sensing circuitry and/or other control circuitry such as a local or remote processor can analyze the touch data to determine a surface of the touch sensor associated with the touch input. In some examples, the control circuitry can ignore touch inputs associated with the second surface, while analyzing touch inputs associated with the first surface to detect one or more predetermined gestures. As another example, the control circuitry can analyze touch inputs associated with the first surface for a first set of predetermined gestures and can analyze touch inputs associated with the second surface for a second set of predetermined gestures.

A sensor system in accordance with example embodiments can include a touch sensor and one or more control circuits that are configured to selectively detect input gestures at the touch sensor based on a surface at which the touch inputs are received. The one or more control circuits can include sensing circuitry configured to detect touch inputs to the touch sensor using the one or more sensing elements. The sensing circuitry can generate sensor data based on the touch inputs. The one or more control circuits can additionally or alternatively include one or more processors local to an interactive object and/or one or more processors remote from the interactive object, such as at one or more remote computing devices.

By way of example, the one or more control circuits can obtain touch data that is generated in response to a touch input to a touch sensor. The touch data can be based at least in part on a response (e.g., resistance or capacitance) associated with a first sensing element of a first subset of conductive sensing elements and a response associated with a second conductive sensing element of a second subset of sensing elements. The control circuit(s) can determine whether the touch input is associated with a first surface of the touch sensor or a second surface of the touch sensor based at least in part on the response associated with the first sensing element and the response associated with the second sensing element.

In accordance with some implementations, the one or more control circuits can analyze a respective response such as a resistance or capacitance of each sensing element of the touch sensor to determine whether a touch input is associated with a first surface of the touch sensor or a second surface of the touch sensor. For instance, the control circuits can determine whether at least one capacitance of the first subset of sensing elements is greater than at least one capacitance of the second subset of sensing elements. The at least one capacitance of each subset can include a capacitance associated with individual sensing elements of each subset, an average capacitance associated with each subset, and/or an accumulated capacitance associated with each subset in various implementations.

In some examples, the one or more control circuits can determine whether at least one signal difference associated with the first subset of sensing elements is greater than at least one signal difference associated with the second subset of sensing elements. For instance, a control circuit can determine for each sensor line in the array a signal difference between the capacitance of such sensor line and the capacitance of its adjacent sensor line(s). An accumulated signal difference value for each sensor line in the first subset can be determined by combining (e.g., adding) the signal difference value for each sensing line in the first subset. An accumulated signal difference value for each sensor line in the second subset can be determined by combining the signal difference value for each sensing line in the second subset. The two accumulated signal difference values can be compared. If the accumulated signal difference value for the first subset is larger than the accumulated signal difference value for the second subset, the control circuit can determine that the touch input is received at the first surface of the touch sensor. If the accumulated signal difference value for the second subset is larger than the accumulated signal difference value for the first subset, the control circuit can determine that the touch input is received at the second surface of the touch sensor.

In accordance with examples embodiments, a sensor system can selectively determine whether a touch input corresponds to a particular input gesture based at least in part on whether the touch input is determined to have been received at first surface of the touch sensor or a second surface of the touch sensor. For example, one or more control circuits of the sensor system can determine if the touch input is associated with the first surface or the second surface. In response to determining that the touch input is associated with the first surface, the sensor system can determine whether the touch data corresponds to one or more gestures or other predetermined movements. For example, the sensor system can compare the touch data with reference data representing one or more predefined parameters to determine if the touch data corresponds to one or more gestures. In response to detecting the first input gesture, the sensor system can initiate a functionality at a computing device. In response to determining that the touch input is associated with the second surface, however, the sensor system can automatically determine that the touch input is not indicative of the particular input gesture such that a functionality is not initiated.

In some implementations, a touch input at a first surface of the touch sensor can be associated with a first input gesture while the same or a similar touch input at a second surface of the touch sensor can be associated with a second input gesture. For example, the sensor system can determine whether touch data generated in response to a touch input is associated with the first surface of the touch sensor or the second surface of the touch sensor. Additionally, the sensor system can determine whether the touch data corresponds to one or more predefined parameters. If the touch data corresponds to the one or more predefined parameters and is associated with the first surface, the sensor system can determine that a first input gesture has been performed. If, however, the touch data corresponds to the one or more predefined parameters and is associated with the second surface, the sensor system can determine that a second input gesture has been performed. By differentiating the surface at which an input is received, the sensor system can detect a larger number of input gestures in example embodiments.

In some examples, a gesture manager can be implemented at one or more computing devices in a computing environment including an interactive object. The gesture manager can be configured to detect a surface of the touch sensor at which a touch input is received, detect one or more gestures or other user movements in response to touch data associated with a touch input, and/or initiate one or more actions in response to detecting the gesture or other user movement. For example, the gesture manager can be configured to initiate a functionality at a computing device and/or provide data indicative of the detected gesture or user movement to applications at a computing device. The gesture manager can be implemented at one or more computing devices of the interactive object and/or at one or more remote computing devices. A gesture or other predetermined motion can be determined based on touch data detected by a touch sensor.

A functionality can be initiated at a local and/or remote computing device in response to detecting a gesture. For example, a gesture manager can be implemented at a computing device and can access a datastore including mappings between gestures and functionalities of the computing device. A functionality mapped to a gesture can be initiated in response to detecting the gesture at the touch sensor. The interactive object can be responsive to gestures detected by an internal electronics module, a removable electronics module, a remote computing device, or any combination of the above.

Touch inputs provided via a resistive or capacitive touch sensor as described may include various applications and capabilities. By way of example, a touch sensor may be used as a button to detect a simple touch input at a location of the touch sensor. In some examples, a one-dimensional array of sensing lines may be used to implement a touch sensor that can detect a button-type input. A one-dimensional array of sensing lines may also be used to detect a one-dimensional swipe input (e.g., movement in a single direction corresponding to the spacing between threads). In some examples, a two-dimensional array of sensing lines may be used to implement a touch sensor that can detect trackpad inputs, including a specific location of a touch within a grid of conductive threads. Additionally, a two-dimensional array of sensing lines may be used to detect various gesture inputs, authentication inputs, pre-defined keystrokes, movements, user-specific natural behaviors and the like. One or more machine-learned models may be used to detect user inputs based on training the machine-learned models using training data. Additionally, the touch sensor may be configured to detect analog and pseudo-force inputs from a capacitive change caused by a finger distance.

The interactive object and/or a computing device in communication with the interactive object can initiate one or more actions based on a detected gesture. For example, a detected gesture can be associated with a navigation command (e.g., scrolling up/down/side, flipping a page, etc.) in one or more user interfaces coupled to the interactive object (e.g., via the capacitive touch sensor, the controller, or both) and/or any of the one or more remote computing devices. In addition, or alternatively, the respective gesture can initiate one or more predefined actions utilizing one or more computing devices, such as, for example, dialing a number, sending a text message, playing a sound recording etc.

Various techniques can be used to detect gestures in accordance with example embodiments of the present disclosure. The sensor system can determine whether touch data corresponds to one or more predefined parameters associated with a particular input gesture in some examples. The interactive object and/or a computing device in communication with the interactive object can detect a correspondence between a touch input and at least one gesture. For example, one or more features of the touch data that correspond to one or more of the predefined parameter(s) for at least one gesture can be identified. By way of example, a correspondence between features and parameters can be identified using matching criteria. A similarity between touch data and a respective gesture can be determined. For example, the similarity between the touch input and the respective gesture can be determined based on a number of corresponding features and parameters. In some examples, a correspondence between the touch data and a respective gesture can be detected based on a respective gesture associated with the largest number of corresponding features and parameters.

The one or more predefined parameters can be stored in a reference database with an identification of a respective gesture in example embodiments. The sensor system can compare the touch data with the one or more predefined parameters to determine whether the particular input gesture has been performed. Examples of pre-defined parameters can include sensing, motion, or other detection parameters. Features of the touch data such as capacitance levels, resistance levels, line activation orders, a number of elements having a capacitance change, etc. can be compared to the pre-defined parameters in some examples. The sensor system can detect the first input gesture in response to the touch data corresponding to the predefined parameters and the touch input being associated with the first surface.

Additionally or alternatively, touch data generated by an interactive object can be input into one or more machine-learned models (e.g., a machine-learned classification model) to detect a surface at which the corresponding touch input was received, and/or to detect one or more predefined gestures. Data indicative of particular surface of the touch sensor and/or data indicative of the detection of a predetermined gesture can be generated as the output of the one or more machine-learned models.

By way of example, a machine-learned classification model can include one or more neural networks (e.g., deep neural networks, convolutional neural networks) or other multi-layer non-linear models. The model(s) can be trained, via one or more machine learning techniques, using training data. The training data can include touch data previously collected by one or more interactive objects at a first surface of a touch sensor and a second surface of a touch sensor. By way of example, one or more interactive objects can generate touch data based on one or more touch inputs associated with a user of the one or more interactive objects. The training data can be labeled to identify a particular surface and/or gesture corresponding to the movement data. The machine-learned classification model can be trained using various training or learning techniques, such as, for example, backwards propagation of errors based on the labeled training data.

In this manner, the machine-learned classification model can be trained to detect particular gestures associated with particular surfaces of a touch sensor based on touch data. In some implementations, touch data can be input into the machine-learned classification model. The machine-learned classification model can ignore touch inputs associated with an unintended surface of the touch sensor in some examples. The machine-learned classification model can generate data indicative of a particular gesture if the touch input is received at an intended input surface and if the touch data touch data matches or otherwise indicates a correspondence with the particular gesture. In other examples, the machine-learned classification model can generate data indicative of a first gesture in response to touch data that is associated with a first surface of the touch sensor and that matches or otherwise indicates a correspondence with the first gesture. The machine-learned classification model can generate data indicative of a second gesture in response to touch data that is associated with a second surface of the touch sensor and that matches or otherwise indicates a correspondence with the second gesture. In some examples, the same or similar touch data received at different surfaces can correspond to different gestures.

By way of example, the machine-learned classification model can include a machine-learned binary classifier model. The model can classify the touch data in a binary manner, such as to indicate whether the touch data is associated with a first surface of the touch sensor (e.g., "1") or whether the touch data is associated with a second surface of the touch sensor (e.g., "0"). Similarly, a machine learned classification model can include a machine learned binary classifier model that can classify touch data as indicative of a particular gesture (e.g., "1") or as not indicative of a particular gesture (e.g., "0").

Although much of the disclosure is described with respect to capacitive touch sensors, it will be appreciated that any type of sensor may be included in a pre-fabricated sensory assembly as described. For example, resistive touch sensors can be formed in a similar manner to capacitive touch sensors as described.

Embodiments of the disclosed technology provide a number of technical effects and benefits, particularly in the areas of computing technology, interactive objects, and the integration of the two. In particular, embodiments of the disclosed technology provide improved techniques for detecting inputs using touch sensors that are integrated with interactive objects such as wearable garments, garment accessories, and garment containers. For example, utilizing embodiments of the disclosed technology, touch inputs at an intended input surface of a touch sensor can be differentiated from inadvertent inputs received at a second surface of the touch sensor, such as may be adjacent to the body of a user with a wearable device is worn. In this manner, movement between the touch sensor and the user's body as may occur during everyday use can be distinguished from intentional inputs provided at the intended input surface of the touch sensor.

In accordance with some examples, a set of flexible sensing elements can be partitioned into a first subset of flexible sensing element and a second subset of flexible sensing elements. A vertical separation can be provided between the subset the flexible sensing elements such that a touch input at a first surface of the touch sensor generates a different capacitive output than a touch input a second surface of the touch sensor. In some examples, the first subset of flexible sensing elements can be formed on a first side of a flexible substrate and the second subset of flexible sensing element can be formed on a second side of the flexible substrate that is opposite to the first side. The vertical separation between the subset and/or the use of a flexible substrate can enable a differentiable capacitive output in response to touch inputs received at the first surface and the second surface, respectively. By utilizing a vertical separation and/or a flexible substrate between the subsets of flexible sensing elements, touch inputs to the first surface and the second surface can be differentiated without the utilization of a separate insulating or shielding layer between the user's body and the touch sensor. In this manner, touch sensors in accordance with example embodiments can be formed without the inclusion of additional and often bulky materials. Such examples can facilitate a more streamlined integration of the touch sensor with various substrates such as textiles and the like.

In some examples, the utilization of different subsets of flexible sensing elements can provide for a larger number of detectable gestures by the touch sensor. For example, touch data indicative of a first input at a first surface can be associated with a first input gesture. The same or similar touch data indicative of an input at a second surface can be associated with a second input gesture. In this manner, the touch sensor can detect multiple gestures in response to the same input, dependent on whether the input is provided at a first surface or a second surface of the touch sensor.

With reference now to the figures, example aspects of the present disclosure will be discussed in greater detail.

FIG. 1 is an illustration of an example environment 100 in which an interactive object including a touch sensor can be implemented. Environment 100 includes a touch sensor 102 (e.g., capacitive or resistive touch sensor), or other sensor. Touch sensor 102 is shown as being integrated within various interactive objects 104. Touch sensor 102 may include one or more sensing elements such as conductive threads or other sensing lines that are configured to detect a touch input. In some examples, a capacitive touch sensor can be formed from an interactive textile which is a textile that is configured to sense multi-touch-input. As described herein, a textile corresponds to any type of flexible woven material consisting of a network of natural or artificial fibers, often referred to as thread or yarn. Textiles may be formed by weaving, knitting, crocheting, knotting, pressing threads together or consolidating fibers or filaments together in a nonwoven manner. A capacitive touch sensor can be formed from any suitable conductive material and in other manners, such as by using flexible conductive lines including metal lines, filaments, etc. attached to a non-woven substrate.

In environment 100, interactive objects 104 include "flexible" objects, such as a shirt 104-1, a hat 104-2, a handbag 104-3 and a shoe 104-6. It is to be noted, however, that touch sensor 102 may be integrated within any type of flexible object made from fabric or a similar flexible material, such as garments or articles of clothing, garment accessories, garment containers, blankets, shower curtains, towels, sheets, bed spreads, or fabric casings of furniture, to name just a few. Examples of garment accessories may include sweat-wicking elastic bands to be worn around the head, wrist, or bicep. Other examples of garment accessories may be found in various wrist, arm, shoulder, knee, leg, and hip braces or compression sleeves. Headwear is another example of a garment accessory, e.g. sun visors, caps, and thermal balaclavas. Examples of garment containers may include waist or hip pouches, backpacks, handbags, satchels, hanging garment bags, and totes. Garment containers may be worn or carried by a user, as in the case of a backpack, or may hold their own weight, as in rolling luggage. Touch sensor 102 may be integrated within flexible objects 104 in a variety of different ways, including weaving, sewing, gluing, and so forth. Flexible objects may also be referred to as a "soft" objects.

In this example, objects 104 further include "hard" objects, such as a plastic cup 104-4 and a hard smart phone casing 104-5. It is to be noted, however, that hard objects 104 may include any type of "hard" or "rigid" object made from non-flexible or semi-flexible materials, such as plastic, metal, aluminum, and so on. For example, hard objects 104 may also include plastic chairs, water bottles, plastic balls, or car parts, to name just a few. In another example, hard objects 104 may also include garment accessories such as chest plates, helmets, goggles, shin guards, and elbow guards. Alternatively, the hard or semi-flexible garment accessory may be embodied by a shoe, cleat, boot, or sandal. Touch sensor 102 may be integrated within hard objects 104 using a variety of different manufacturing processes. In one or more implementations, injection molding is used to integrate touch sensors into hard objects 104.

Touch sensor 102 enables a user to control an object 104 with which the touch sensor 102 is integrated, or to control a variety of other computing devices 106 via a network 108. Computing devices 106 are illustrated with various non-limiting example devices: server 106-1, smart phone 106-2, laptop 106-3, computing spectacles 106-4, television 106-5, camera 106-6, tablet 106-7, desktop 106-8, and smart watch 106-9, though other devices may also be used, such as home automation and control systems, sound or entertainment systems, home appliances, security systems, netbooks, and e-readers. Note that computing device 106 can be wearable (e.g., computing spectacles and smart watches), non-wearable but mobile (e.g., laptops and tablets), or relatively immobile (e.g., desktops and servers). Computing device 106 may be a local computing device, such as a computing device that can be accessed over a Bluetooth connection, near-field communication connection, or other local-network connection. Computing device 106 may be a remote computing device, such as a computing device of a cloud computing system.

Network 108 includes one or more of many types of wireless or partly wireless communication networks, such as a local-area-network (LAN), a wireless local-area-network (WLAN), a personal-area-network (PAN), a wide-area-network (WAN), an intranet, the Internet, a peer-to-peer network, point-to-point network, a mesh network, and so forth.

Touch sensor 102 can interact with computing devices 106 by transmitting touch data or other sensor data through network 108. Additionally or alternatively, touch sensor 102 may transmit gesture data, movement data, or other data derived from sensor data generated by the touch sensor 102. Computing device 106 can use the touch data to control computing device 106 or applications at computing device 106. As an example, consider that touch sensor 102 integrated at shirt 104-1 may be configured to control the user's smart phone 106-2 in the user's pocket, television 106-5 in the user's home, smart watch 106-9 on the user's wrist, or various other appliances in the user's house, such as thermostats, lights, music, and so forth. For example, the user may be able to swipe up or down on touch sensor 102 integrated within the user's shirt 104-1 to cause the volume on television 106-5 to go up or down, to cause the temperature controlled by a thermostat in the user's house to increase or decrease, or to turn on and off lights in the user's house. Note that any type of touch, tap, swipe, hold, or stroke gesture may be recognized by touch sensor 102.

Figure 2:
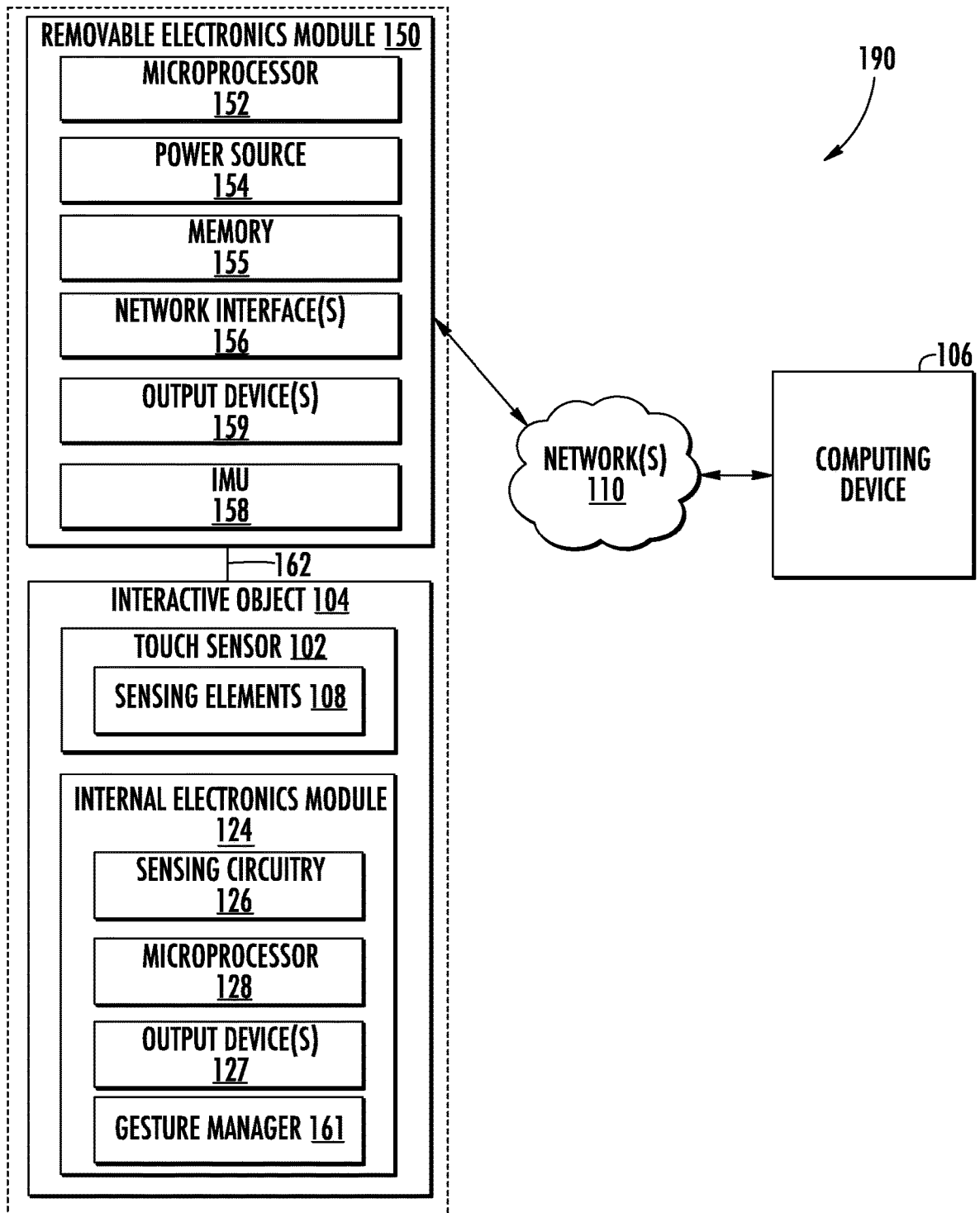
FIG. 2 is a block diagram of an example computing environment that includes an interactive object having a touch sensor in accordance with example embodiments of the present disclosure.

In more detail, consider FIG. 2 which illustrates an example system 190 that includes an interactive object 104, a removable electronics module 150, and a computing device 106. In system 190, touch sensor 102 is integrated in an object 104, which may be implemented as a flexible object (e.g., shirt 104-1, hat 104-2, or handbag 104-3) or a hard object (e.g., plastic cup 104-4 or smart phone casing 104-5).

Touch sensor 102 is configured to sense touch-input from a user when one or more fingers of the user's hand touch or approach touch sensor 102. Touch sensor 102 may be configured as a capacitive touch sensor or resistive touch sensor to sense single-touch, multi-touch, and/or full-hand touch-input from a user. To enable the detection of touch-input, touch sensor 102 includes sensing elements 110. Sensing elements may include various shapes and geometries. In some examples, sensing elements 110 can be formed as a grid, array, or parallel pattern of sensing lines so as to detect touch input. In some implementations, the sensing elements 110 do not alter the flexibility of touch sensor 102, which enables touch sensor 102 to be easily integrated within interactive objects 104.

Interactive object 104 includes an internal electronics module 124 (also referred to as internal electronics device) that is embedded within interactive object 104 and is directly coupled to sensing elements 110. Internal electronics module 124 can be communicatively coupled to a removable electronics module 150 (also referred to as a removable electronics device) via a communication interface 162. Internal electronics module 124 contains a first subset of electronic circuits or components for the interactive object 104, and removable electronics module 150 contains a second, different, subset of electronic circuits or components for the interactive object 104. As described herein, the internal electronics module 124 may be physically and permanently embedded within interactive object 104, whereas the removable electronics module 150 may be removably coupled to interactive object 104.

In system 190, the electronic components contained within the internal electronics module 124 include sensing circuitry 126 that is coupled to sensing elements 110 that form the touch sensor 102. In some examples, the internal electronics module includes a flexible printed circuit board (PCB). The printed circuit board can include a set of contact pads for attaching to the conductive lines. In some examples, the printed circuit board includes a microprocessor. For example, wires from conductive threads may be connected to sensing circuitry 126 using flexible PCB, creping, gluing with conductive glue, soldering, and so forth. In one embodiment, the sensing circuitry 126 can be configured to detect a user-inputted touch-input on the conductive threads that is pre-programmed to indicate a certain request. In one embodiment, when the conductive threads form a grid or other pattern, sensing circuitry 126 can be configured to also detect the location of the touch-input on sensing element 110, as well as motion of the touch-input. For example, when an object, such as a user's finger, touches sensing element 110, the position of the touch can be determined by sensing circuitry 126 by detecting a change in capacitance on the grid or array of sensing element 110. The touch-input may then be used to generate touch data usable to control a computing device 106. For example, the touch-input can be used to determine various gestures, such as single-finger touches (e.g., touches, taps, and holds), multi-finger touches (e.g., two-finger touches, two-finger taps, two-finger holds, and pinches), single-finger and multi-finger swipes (e.g., swipe up, swipe down, swipe left, swipe right), and full-hand interactions (e.g., touching the textile with a user's entire hand, covering textile with the user's entire hand, pressing the textile with the user's entire hand, palm touches, and rolling, twisting, or rotating the user's hand while touching the textile).

Internal electronics module 124 can include various types of electronics, such as sensing circuitry 126, sensors (e.g., capacitive touch sensors woven into the garment, microphones, or accelerometers), output devices (e.g., LEDs, speakers, or micro-displays), electrical circuitry, and so forth. Removable electronics module 150 can include various electronics that are configured to connect and/or interface with the electronics of internal electronics module 124. Generally, the electronics contained within removable electronics module 150 are different than those contained within internal electronics module 124, and may include electronics such as microprocessor 152, power source 154 (e.g., a battery), memory 155, network interface 156 (e.g., Bluetooth, WiFi, USB), sensors (e.g., accelerometers, heart rate monitors, pedometers, IMUs), output devices (e.g., speakers, LEDs), and so forth.

In some examples, removable electronics module 150 is implemented as a strap or tag that contains the various electronics. The strap or tag, for example, can be formed from a material such as rubber, nylon, plastic, metal, or any other type of fabric. Notably, however, removable electronics module 150 may take any type of form. For example, rather than being a strap, removable electronics module 150 could resemble a circular or square piece of material (e.g., rubber or nylon).

The inertial measurement unit(s) (IMU(s)) 158 can generate sensor data indicative of a position, velocity, and/or an acceleration of the interactive object. The IMU(s) 158 may generate one or more outputs describing one or more three-dimensional motions of the interactive object 104. The IMU(s) may be secured to the internal electronics module 124, for example, with zero degrees of freedom, either removably or irremovably, such that the inertial measurement unit translates and is reoriented as the interactive object 104 is translated and are reoriented. In some embodiments, the inertial measurement unit(s) 158 may include a gyroscope or an accelerometer (e.g., a combination of a gyroscope and an accelerometer), such as a three axis gyroscope or accelerometer configured to sense rotation and acceleration along and about three, generally orthogonal axes. In some embodiments, the inertial measurement unit(s) may include a sensor configured to detect changes in velocity or changes in rotational velocity of the interactive object and an integrator configured to integrate signals from the sensor such that a net movement may be calculated, for instance by a processor of the inertial measurement unit, based on an integrated movement about or along each of a plurality of axes.

Communication interface 162 enables the transfer of power and data (e.g., the touch-input detected by sensing circuitry 126) between the internal electronics module 124 and the removable electronics module 260. In some implementations, communication interface 162 may be implemented as a connector that includes a connector plug and a connector receptacle. The connector plug may be implemented at the removable electronics module 150 and is configured to connect to the connector receptacle, which may be implemented at the interactive object 104. One or more communication interface(s) may be included in some examples. For instance, a first communication interface may physically couple the removable electronics module 150 to one or more computing devices 106, and a second communication interface may physically couple the removable electronics module 150 to interactive object 104.

In system 190, the removable electronics module 150 includes a microprocessor 152, power source 154, and network interface 156. Power source 154 may be coupled, via communication interface 162, to sensing circuitry 126 to provide power to sensing circuitry 126 to enable the detection of touch-input, and may be implemented as a small battery. When touch-input is detected by sensing circuitry 126 of the internal electronics module 124, data representative of the touch-input may be communicated, via communication interface 162, to microprocessor 152 of the removable electronics module 150. Microprocessor 152 may then analyze the touch-input data to generate one or more control signals, which may then be communicated to a computing device 106 (e.g., a smart phone, server, cloud computing infrastructure, etc.) via the network interface 156 to cause the computing device to initiate a particular functionality. Generally, network interfaces 156 are configured to communicate data, such as touch data, over wired, wireless, or optical networks to computing devices. By way of example and not limitation, network interfaces 156 may communicate data over a local-area-network (LAN), a wireless local-area-network (WLAN), a personal-area-network (PAN) (e.g., Bluetooth™), a wide-area-network (WAN), an intranet, the Internet, a peer-to-peer network, point-to-point network, a mesh network, and the like (e.g., through network 108 of FIG. 1 and FIG. 2).

Object 104 may also include one or more output devices 127 configured to provide a haptic response, a tactical response, an audio response, a visual response, or some combination thereof. Similarly, removable electronics module 150 may include one or more output devices 159 configured to provide a haptic response, tactical response, and audio response, a visual response, or some combination thereof. Output devices may include visual output devices, such as one or more light-emitting diodes (LEDs), audio output devices such as one or more speakers, one or more tactile output devices, and/or one or more haptic output devices. In some examples, the one or more output devices are formed as part of removable electronics module, although this is not required. In one example, an output device can include one or more LEDs configured to provide different types of output signals. For example, the one or more LEDs can be configured to generate a circular pattern of light, such as by controlling the order and/or timing of individual LED activations. Other lights and techniques may be used to generate visual patterns including circular patterns. In some examples, one or more LEDs may produce different colored light to provide different types of visual indications. Output devices may include a haptic or tactile output device that provides different types of output signals in the form of different vibrations and/or vibration patterns. In yet another example, output devices may include a haptic output device such as may tighten or loosen an interactive garment with respect to a user. For example, a clamp, clasp, cuff, pleat, pleat actuator, band (e.g., contraction band), or other device may be used to adjust the fit of a garment on a user (e.g., tighten and/or loosen). In some examples, an interactive textile may be configured to tighten a garment such as by actuating conductive threads within the touch sensor 102.

A gesture manager 161 is capable of interacting with applications at computing devices 106 and touch sensor 102 effective to aid, in some cases, control of applications through touch-input received by touch sensor 102. For example, gesture manager 161 can interact with applications. In FIG. 2, gesture manager 161 is illustrated as implemented at removable electronics module 150. It will be appreciated, however, that gesture manager 161 may be implemented at internal electronics module 124, a computing device 106 remote from the interactive object, or some combination thereof. A gesture manager may be implemented as a standalone application in some embodiments. In other embodiments, a gesture manager may be incorporated with one or more applications at a computing device.

A gesture or other predetermined motion can be determined based on touch data detected by the touch sensor 102 and/or an inertial measurement unit 158 or other sensor. For example, gesture manager 161 can determine a gesture based on touch data, such as single-finger touch gesture, a double-tap gesture, a two-finger touch gesture, a swipe gesture, and so forth. As another example, gesture manager 161 can determine a gesture based on movement data such as a velocity, acceleration, etc. as can be determined by inertial measurement unit 158.

A functionality associated with a gesture can be determined by gesture manager 161 and/or an application at a computing device. In some examples, it is determined whether the touch data corresponds to a request to perform a particular functionality. For example, the motion manager determines whether touch data corresponds to a user input or gesture that is mapped to a particular functionality, such as initiating a vehicle service, triggering a text message or other notification, answering a phone call, creating a journal entry, and so forth. As described throughout, any type of user input or gesture may be used to trigger the functionality, such as swiping, tapping, or holding touch sensor 102. In one or more implementations, a motion manager enables application developers or users to configure the types of user input or gestures that can be used to trigger various different types of functionalities. For example, a motion manager can cause a particular functionality to be performed, such as by sending a text message or other communication, answering a phone call, creating a journal entry, increase the volume on a television, turn on lights in the user's house, open the automatic garage door of the user's house, and so forth.

While internal electronics module 124 and removable electronics module 150 are illustrated and described as including specific electronic components, it is to be appreciated that these modules may be configured in a variety of different ways. For example, in some cases, electronic components described as being contained within internal electronics module 124 may be at least partially implemented at the removable electronics module 150, and vice versa. Furthermore, internal electronics module 124 and removable electronics module 150 may include electronic components other that those illustrated in FIG. 2, such as sensors, light sources (e.g., LED's), displays, speakers, and so forth.

Figure 3:
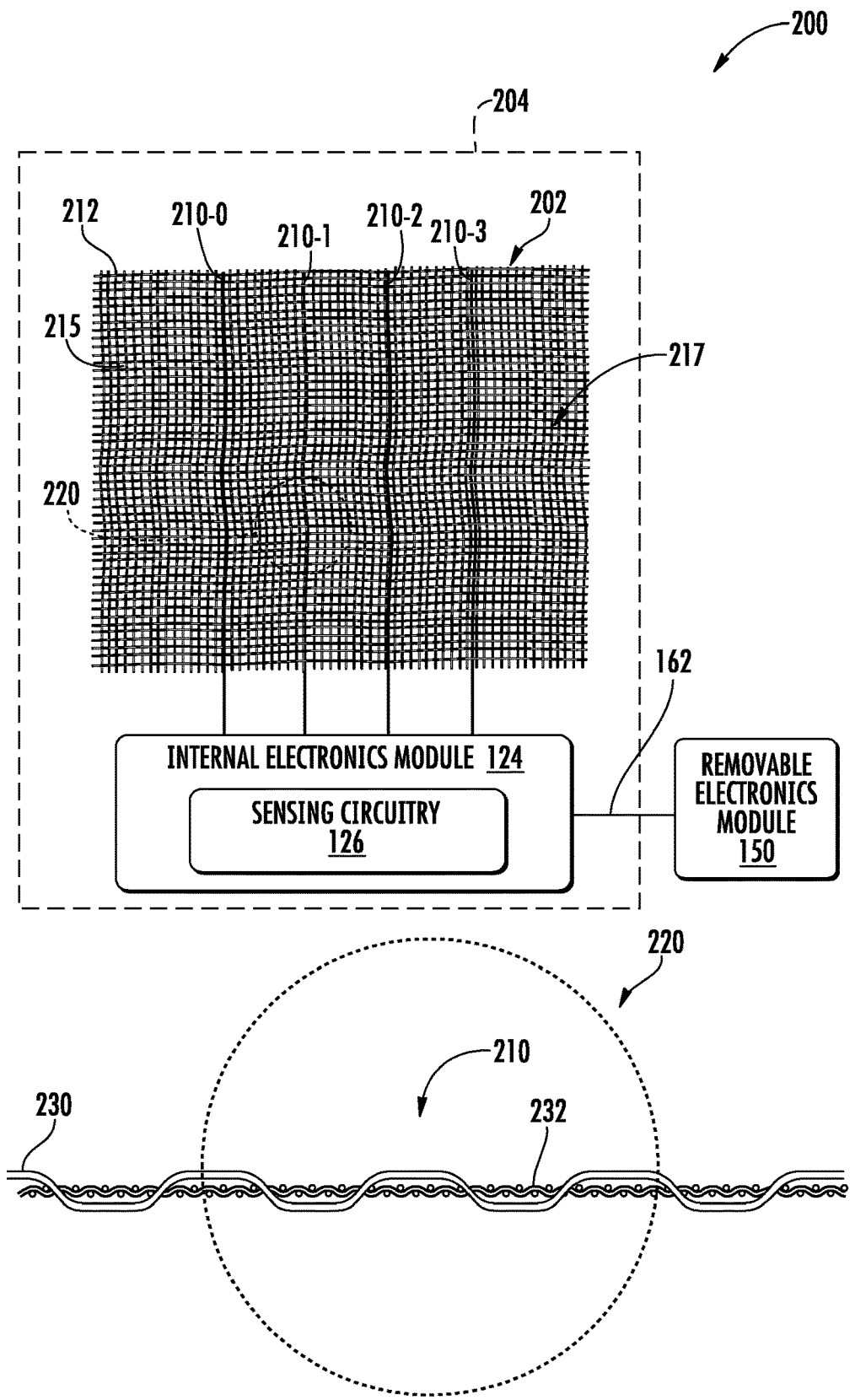
FIG. 3 depicts an example of a touch sensor in accordance with example embodiments of the present disclosure.

FIG. 3 illustrates an example of a sensor system 200, such as can be integrated with an interactive object 204 in accordance with one or more implementations. In this example, the sensing elements 110 are implemented as conductive threads 210 on or within a substrate 215. Touch sensor 202 includes non-conductive threads 212 woven with conductive threads 210 to form a capacitive touch sensor 202 (e.g., interactive textile). It is noted that a similar arrangement may be used to form a resistive touch sensor. Non-conductive threads 212 may correspond to any type of non-conductive thread, fiber, or fabric, such as cotton, wool, silk, nylon, polyester, and so forth.

At 220, a zoomed-in view of conductive thread 210 is illustrated. Conductive thread 210 includes a conductive wire 230 or a plurality of conductive filaments that are twisted, braided, or wrapped with a flexible thread 232. As shown, the conductive thread 210 can be woven with or otherwise integrated with the non-conductive threads 212 to form a fabric or a textile. Although a conductive thread and textile is illustrated, it will be appreciated that other types of sensing elements and substrates may be used, such as flexible metal lines formed on a plastic substrate.

In one or more implementations, conductive wire 230 is a thin copper wire. It is to be noted, however, that the conductive wire 230 may also be implemented using other materials, such as silver, gold, or other materials coated with a conductive polymer. The conductive wire 230 may include an outer cover layer formed by braiding together non-conductive threads. The flexible thread 232 may be implemented as any type of flexible thread or fiber, such as cotton, wool, silk, nylon, polyester, and so forth.

Capacitive touch sensor 202 can be formed cost-effectively and efficiently, using any conventional weaving process (e.g., jacquard weaving or 3D-weaving), which involves interlacing a set of longer threads (called the warp) with a set of crossing threads (called the weft). Weaving may be implemented on a frame or machine known as a loom, of which there are a number of types. Thus, a loom can weave non-conductive threads 212 with conductive threads 210 to create capacitive touch sensor 202. In another example, capacitive touch sensor 202 can be formed using a predefined arrangement of sensing lines formed from a conductive fabric such as an electro-magnetic fabric including one or more metal layers.

The conductive threads 210 can be formed into the touch sensor 202 in any suitable pattern or array. In one embodiment, for instance, the conductive threads 210 may form a single series of parallel threads. For instance, in one embodiment, the capacitive touch sensor may comprise a single plurality of parallel conductive threads conveniently located on the interactive object, such as on the sleeve of a jacket.

In an alternative embodiment, the conductive threads 210 may form a grid that includes a first set of substantially parallel conductive threads and a second set of substantially parallel conductive threads that crosses the first set of conductive threads to form the grid. For instance, the first set of conductive threads can be oriented horizontally and the second set of conductive threads can be oriented vertically, such that the first set of conductive threads are positioned substantially orthogonal to the second set of conductive threads. It is to be appreciated, however, that conductive threads may be oriented such that crossing conductive threads are not orthogonal to each other. For example, in some cases crossing conductive threads may form a diamond-shaped grid. While conductive threads 210 are illustrated as being spaced out from each other in FIG. 3, it is to be noted that conductive threads 210 may be formed very closely together. For example, in some cases two or three conductive threads may be weaved closely together in each direction. Further, in some cases the conductive threads may be oriented as parallel sensing lines that do not cross or intersect with each other.

In example system 200, sensing circuity 126 is shown as being integrated within object 104, and is directly connected to conductive threads 210. During operation, sensing circuitry 126 can determine positions of touch-input on the conductive threads 210 using self-capacitance sensing or projective capacitive sensing.

For example, when configured as a self-capacitance sensor, sensing circuitry 126 charges crossing conductive threads 210 (e.g., horizontal and vertical conductive threads) by applying a control signal (e.g., a sine signal) to each conductive thread 210. When an object, such as the user's finger, touches the grid of conductive thread 210, the conductive threads 210 that are touched are grounded, which changes the capacitance (e.g., increases or decreases the capacitance) on the touched conductive threads 210.

Sensing circuitry 126 uses the change in capacitance to identify the presence of the object (e.g., user's finger, stylus, etc.). When a grid is used, sensing circuitry 126 detects a position of the touch-input by detecting which horizontal conductive thread is touched, and which vertical conductive thread is touched by detecting changes in capacitance of each respective conductive thread 210. Sensing circuitry 126 uses the intersection of the crossing conductive threads 210 that are touched to determine the position of the touch-input on the grid of conductive threads 210. For example, sensing circuitry 126 can determine touch data by determining the position of each touch as X,Y coordinates on the grid of conductive thread 210.

Alternately, when implemented as a projective capacitance sensor, sensing circuitry 126 charges a single set of conductive threads 210 (e.g., vertical conductive threads 210) by applying a control signal (e.g., a sine signal) to the single set of conductive threads 210. Then, sensing circuitry 126 senses changes in capacitance in the other set of conductive threads 210 (e.g., vertical conductive threads).

In a projective capacitance implementation, vertical conductive threads are not charged and thus act as a virtual ground. However, when horizontal conductive threads are charged, the horizontal conductive threads capacitively couple to vertical conductive threads. Thus, when an object, such as the user's finger, touches the grid of conductive thread, the capacitance changes on the vertical conductive threads (e.g., increases or decreases). Sensing circuitry 126 uses the change in capacitance on vertical conductive threads to identify the presence of the object. To do so, sensing circuitry 126 detects a position of the touch-input by scanning vertical conductive threads to detect changes in capacitance. Sensing circuitry 126 determines the position of the touch-input as the intersection point between the vertical conductive thread with the changed capacitance, and the horizontal conductive thread on which the control signal was transmitted. For example, sensing circuitry 126 can determine touch data by determining the position of each touch as X,Y coordinates on the grid of conductive thread.

Whether implemented as a self-capacitance sensor or a projective capacitance sensor, the conductive thread 210 and sensing circuitry 126 is configured to communicate the touch data that is representative of the detected touch-input to gesture manager 161 (e.g., at removable electronics module 150). The microprocessor 152 may then cause communication of the touch data, via network interface 156, to computing device 106 to enable the device to determine gestures based on the touch data, which can be used to control object 104, computing device 106, or applications implemented at computing device 106. In some implementations, a predefined motion may be determined by the internal electronics module and/or the removable electronics module and data indicative of the predefined motion can be communicated to a computing device 106 to control object 104, computing device 106, or applications implemented at computing device 106.

In accordance with some embodiments, a plurality of sensing lines can be formed from a multilayered flexible film to facilitate a flexible sensing line. For example, the multilayered film may include one or more flexible base layers such as a flexible textile, plastic, or other flexible material. One or more metal layers may extend over the flexible base layer(s). Optionally, one or more passivation layers can extend over the one or more flexible base layers and the one or more metal layer(s) to promote adhesion between the metal layer(s) and the base layer(s). In accordance with some examples, a multilayered sheet including one or more flexible base layers, one or more metal layers, and optionally one or more passivation layers can be formed and then cut, etched, or otherwise divided into individual sensing lines. Each sensing line can include a line of the one or more metal layers formed over a line of the one or more flexible base layers. Optionally, a sensing line can include a line of one or more passivation layers overlying the one or more flexible base layers. An electromagnetic field shielding fabric can be used to form the sensing lines in some examples.

The plurality of conductive threads 210 forming touch sensor 202 are integrated with non-conductive threads 212 to form flexible substrate 215. A first subset of conductive threads 210-1 and 210-3 are coupled to a first side 217 of the flexible substrate and a second subset of conductive threads 210-2 in 210-4 are coupled to a second side (not shown) of the flexible substrate. The first side is opposite the second side in a direction orthogonal to first side and the second side. Any number of conductive threads may be used to form a touch sensor. Moreover, any number of conductive threads may be used to fund the individual subset example embodiments.

One or more control circuits of the sensor system 200 can obtain touch data associated with a touch input to touch sensor 202. The one or more control circuits can include sensing circuitry 126 and/or a computing device such as a microprocessor 128 at the internal electronics module, microprocessor 152 at the removable electronics module 150, and/or a remote computing device 106. The one or more control circuits can implement gesture manager 161 in example embodiments. The touch data can include data associated with a respective response by each of the plurality of conductive threads 210. The touch data can include, for example, a capacitance associated with the conductive threads 210-1 and 210-3 at the top side of the substrate, as well as the conductive threads 210-2 and 210-4 at the bottom side of the substrate. The control circuit(s) can determine whether the touch input is associated with the first subset of conductive threads 210-1, 201-3 or the second subset of thread 210-2, 210-4. The control circuit(s) can classify the touch input as associated with a particular subset based at least in part on the respective response to the touch input by the plurality of conductive sensing elements.

The control circuits(s) can be configured to detect a surface of the touch sensor at which a touch input is received, detect one or more gestures or other user movements in response to touch data associated with a touch input, and/or initiate one or more actions in response to detecting the gesture or other user movement. By way of example, control circuit(s) can obtain touch data that is generated in response to a touch input to touch sensor 202. The touch data can be based at least in part on a response (e.g., resistance or capacitance) associated with sensing elements from each subset of sensing elements. The control circuit(s) can determine whether the touch input is associated with a first surface of the touch sensor or a second surface of the touch sensor based at least in part on the response associated with the first sensing element and the response associated with the second sensing element. The control circuit(s) can selectively determine whether a touch input corresponds to a particular input gesture based at least in part on whether the touch input is determined to have been received at first surface of the touch sensor or a second surface of the touch sensor. Notably, the control circuit(s) can analyze the touch data from each subset of sensing elements to determine whether a particular gesture has been performed. In this regard, the control circuits can utilize the individual subsets of elements to identify particular surface of the touch sensor. However, the control circuits can utilize the full set of sensing elements to identify whether a gesture has been performed.

Figure 4:
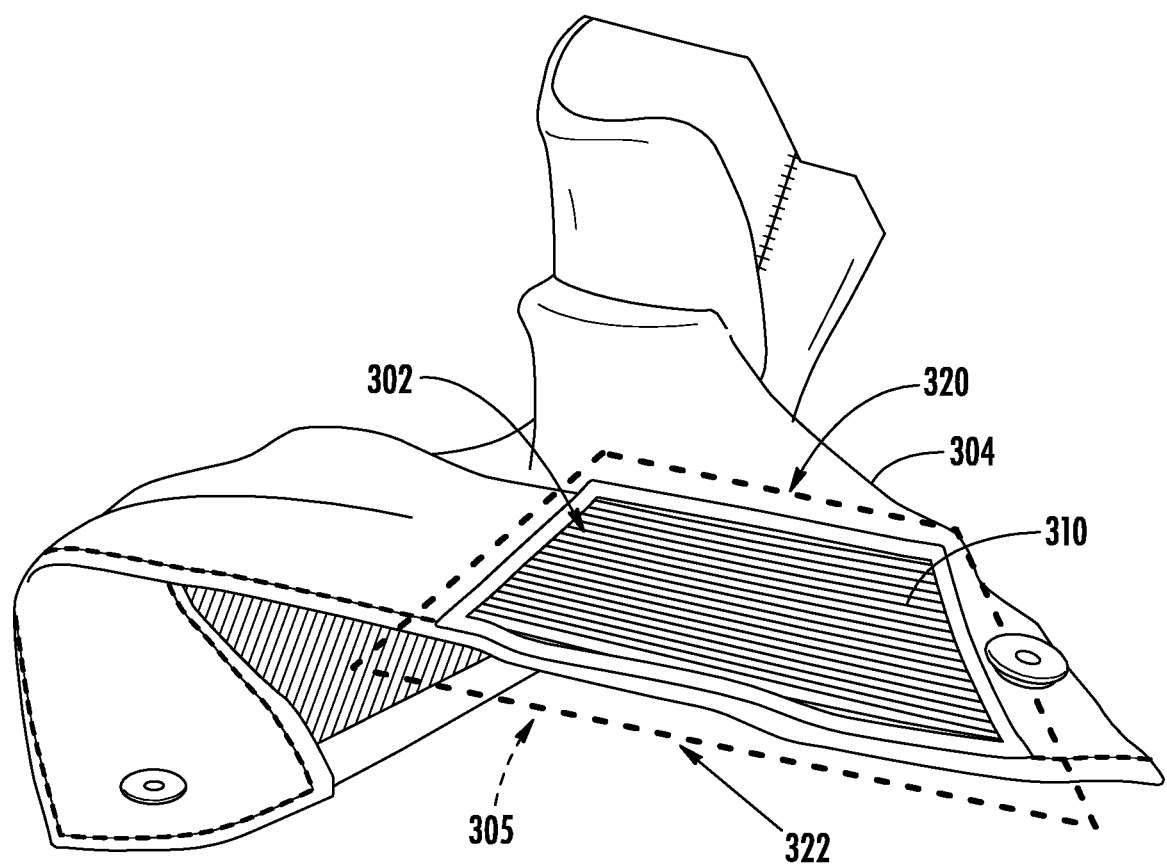
FIG. 4 depicts an example of a touch sensor integrated with an interactive object in accordance with example embodiments of the present disclosure.

FIG. 4 is a perspective view of an example of an interactive object including a capacitive touch sensor 302 in accordance with example embodiments of the present disclosure. In this example, the interactive object is an interactive garment 304 having a capacitive touch sensor 302 integrated in the cuff of a sleeve. By way of example, the user can perform a gesture by brushing in on the cuff of the interactive object 104 cuff where the capacitive touch sensor 302 is placed. Gesture manager 161 can be configured to initiate and/or implement one or more functionalities in response to the brush in gesture. For example, a user may perform a brush in gesture in order to receive a notification related to an application at the remote computing device (e.g., having a text message converted into an audible output at the remote computing device). Note that any type of touch, tap, swipe, hold, or stroke gesture may be recognized by capacitive touch sensor 302. In an alternate example, a resistive touch sensor may be used rather than capacitive touch sensor.

The conductive sensing elements 310 in FIG. 4 are positioned at a touch sensor area 305. The sensing elements 310 can be partitioned into subsets of sensing elements to enable a sensor system to distinguish between touch inputs at an intended touch input surface 320 and touch inputs at an unintended second surface 322. The second surface can be positioned toward a user's body when the interactive garment is worn. In traditional designs, it may be difficult to distinguish a touch between the intended touch input surface 320 and the unintended second surface 322. Typically, thick padding is provided between the user's body and the touch sensor to attenuate the capacitive signal generated in response to the user's body at the unintended second surface 322.

In accordance with example embodiments, the first subset of conductive sensing elements can be coupled to a first side of a flexible substrate and the second subset of conductive sensing elements can be coupled to a second side of the flexible substrate. The first side can be positioned closer to the intended touch input surface 320 and the second side can be positioned further from the intended touch input surface 320 and closer to the second surface 322 which will be adjacent to the user when worn. For example, the first side can be adjacent to the intended touch input surface and the second side can be adjacent to one or more portions of the user's body when the interactive garment is worn by the user. In some embodiments, the first side of the flexible substrate and the second side of the flexible substrate can be separated in the direction orthogonal to the first side and the second side of the flexible substrate. By positioning subsets of sensing elements on opposite sides of the substrate, the capacitive signal generated by the user's body at the second surface can be distinguished from the capacitive signal generated by the touch input at the intended touch input surface.

In accordance with example embodiments, the first and second subsets of sensing elements can be separated in a vertical direction to provide signal differentiation to distinguish inputs provided at the intended input surface from inputs provided at the unintended second surface. For example, the sensing elements can be arranged as parallel sensing lines as shown in FIG. 4. The sensing lines can be elongated in a first direction with a separation therebetween in a second direction orthogonal to the first direction. A first subset of the parallel sensing lines and a second subset of the parallel sensing lines can be separated in a direction orthogonal to the first direction and the second direction. Notably, this separation can be provided with or without of the use of a flexible substrate to which the lines are coupled. A touch input provided at the intended touch input surface (e.g., +vertical axis 205) can generate a stronger signal (e.g., capacitance) on the first subset of lines than the second subset of lines. A touch input provided at the unintended second surface (e.g., −vertical axis) can generate a stronger signal (e.g., capacitance) on the second subset of lines than the first subset of lines.

Figure 5:
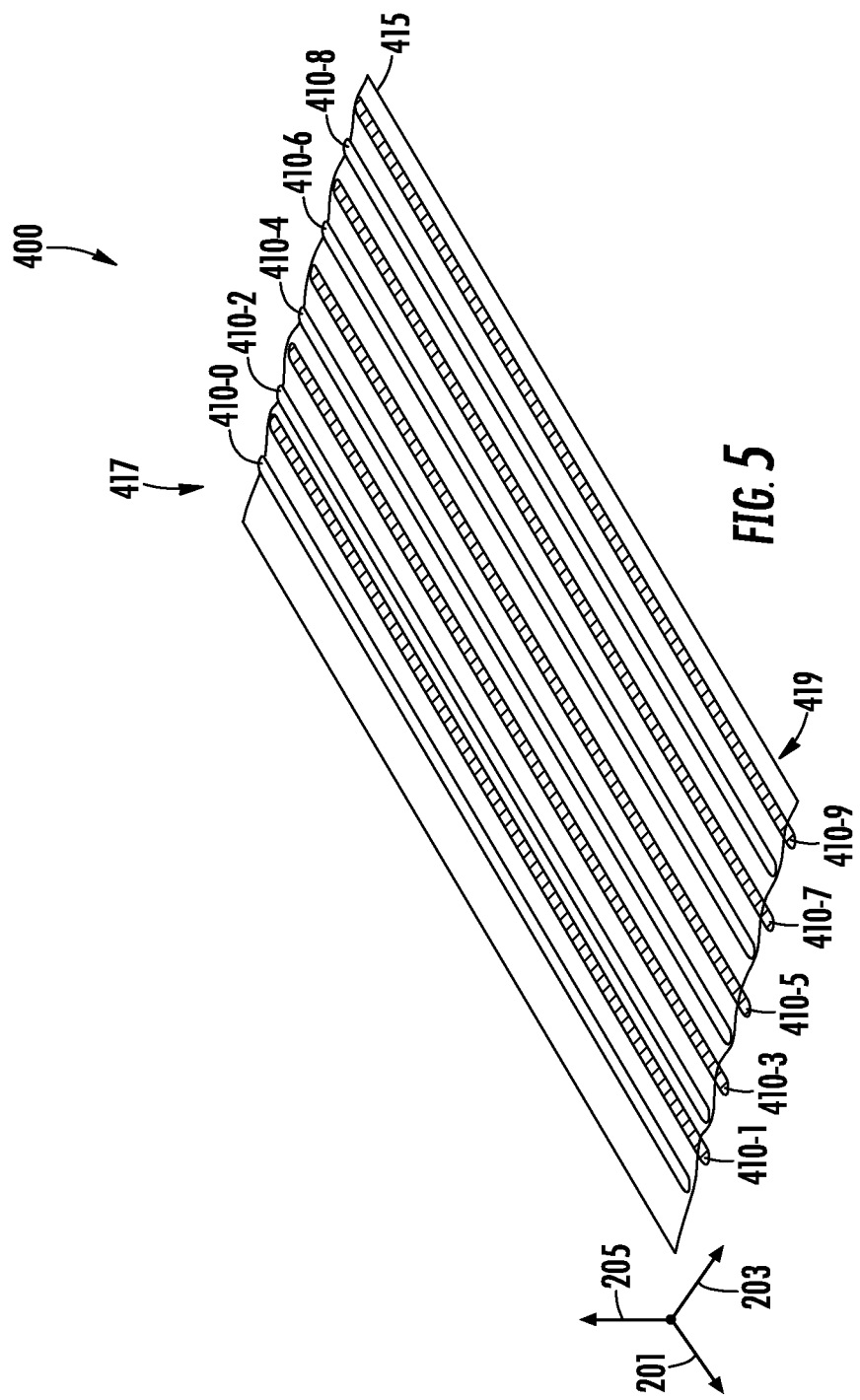
FIG. 5 is a perspective view depicting an example of a touch sensor including individual subsets of sensing lines formed on opposite sides of a substrate in accordance with example embodiments of the present disclosure.

FIG. 5 is a perspective view depicting an example of a sensor system 400 including a touch sensor 402 including individual subsets of sensing element formed on opposite sides of a substrate in accordance with example embodiments of the present disclosure. Each conductive sensing element 410 of the plurality of conductive sensing elements is coupled to substrate 415 and is elongated in a longitudinal direction corresponding to longitudinal axis 201 with a spacing between conductive sensing elements that are adjacent in the lateral direction corresponding to lateral axis 203. The set of conductive sensing elements 410 in this example is a set of parallel sensing lines that are elongated parallel the longitudinal axis 201 with a spacing between sensing lines that are adjacent in the lateral direction orthogonal to the longitudinal direction. The set of parallel sensing lines can be non-crossing lines that are elongated in the first direction without overlapping. For example, the non-crossing lines can form a conductive line pattern without intersecting, touching, or crossing underneath or over one another at an intended touch input area of the touch sensor. The set of parallel sensing lines can include a first subset of sensing lines that is separated from a second subset of sensing lines in a vertical direction that is orthogonal to both the longitudinal direction and the lateral direction. For instance, the set of parallel sensing lines can be elongated in a longitudinal direction with a spacing between the conductive sensing lines that are adjacent in a lateral direction.

Each conductive sensing element of the first subset of conductive sensing elements is adjacent, in the lateral direction, to at least one conductive sensing element of the second subset of conductive sensing elements. The sensor system can be integrated with various interactive object such as a wearable device. The first side 417 of the flexible substrate can adjacent to an intended input surface of the touch sensor while the second side 419 can be adjacent to one or more portions of a body of a user when the wearable device is worn by a user.

The set of conductive sensing elements 410 can be coupled to opposite sides of flexible substrate 415. For example, a first subset of conductive sensing elements 410-0, 410-2, 410-4, 410-6, and 410-8 can be coupled to a first side 417 of the flexible substrate 415 and a second subset of flexible sensing elements 410-1, 410-3, 410-5, 410-7, and 410-9 can be coupled to a second side 419 of the flexible substrate 415. The first and second sides can be opposite sides in a direction along the vertical axis 205, orthogonal to the first and second surfaces of the touch sensor. In some examples, the first subset of conductive sensing elements and the second subset of conductive sensing elements can be separated by a distance in the vertical direction orthogonal to the first surface and the second surface of the touch sensor as shown in FIG. 5. In other examples, however, the first subset of conductive sensing elements and the second subset of sensing elements can be formed in the same vertical plane, without a vertical spacing therebetween.

The set of sensing elements 410 can be formed by interleaving the first subset of sensing elements 410-0, 410-2, 410-4, 410-6, and 410-8 with the second subset of sensing elements 410-1, 410-3, 410-5, 410-7, and 410-9. For instance, alternating ones of the set of conductive sensing elements can be formed on the first side 417 and the second side 419 such that the first subset of conductive sensing lines is formed on the first side and the second subset of sensing elements is formed on the second side. In FIG. 5, alternating ones of the set of sensing elements are on the first side and the second side such that an equal number of sensing element are formed on each side. In other examples, an unequal number of sensing elements can be formed on each side. The set of flexible conductive sensing elements can form a sequence with a spacing provided between sequential sensing lines that are adjacent in the direction of lateral axis 203. The sequence of flexible conductive sensing lines in the second direction can form the subset of even sensing elements 410-0, 410-2, 410-4, 410-6, and 410-8 and the subset of odd sensing elements 410-1, 410-3, 410-5, 410-7, and 410-9.

Figure 6:
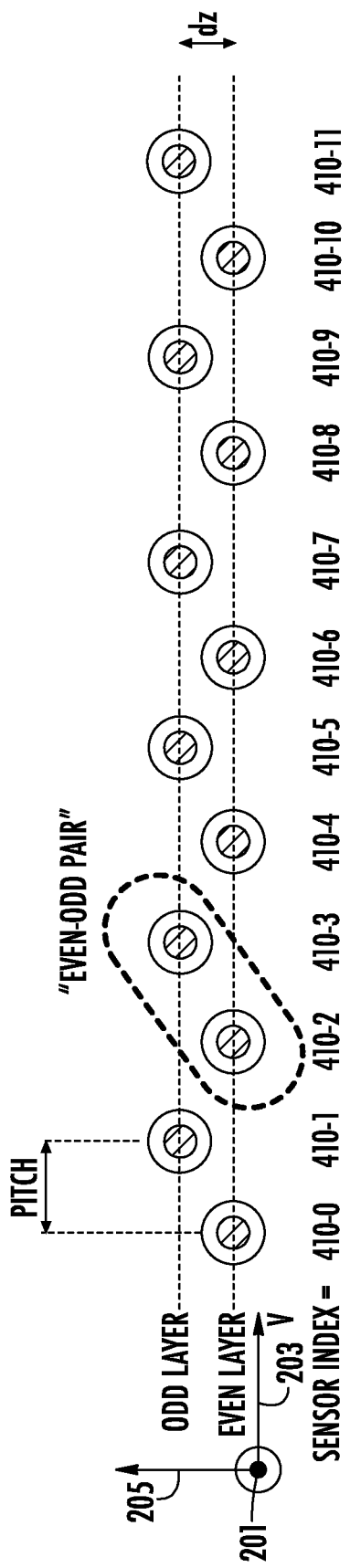
FIG. 6 is a graphical diagram depicting the sensing lines in FIG. 5, illustrating a vertical spacing between the individual subsets of sensing lines in accordance with example embodiments of the present disclosure.

FIG. 6 is a graphical diagram illustrating the sensing lines of FIG. 5 with a vertical spacing between the individual subsets of sensing lines in accordance with example embodiments of the present disclosure. FIG. 6 depicts a cross-sectional view of the conductive sensing elements, illustrating a vertical separation dz along the vertical axis 205 between the first subset 440 of sensing elements 410-0, 410-2, 410-4, 410-6, and 410-8 and the second subset 442 of sensing elements 410-1, 410-3, 410-5, 410-7, and 410-9. The center of each sensing element of the first subset defines a first plane that extends along the longitudinal axis 201 and lateral axis 203. The first subset 440 of sensing elements may be referred to as an even layer of sensing elements. The center of each sensing element of the second subset defines a second plane that extends along the lateral axis 203 and longitudinal axis 201. The second subset 442 of sensing elements may be referred to as an odd layer of sensing elements. The first plane and the second plane are separated in a vertical direction along the vertical axis 205. The vertical separation or distance dz between the subsets of sensing elements enables inputs at a first surface of the touch sensor to be distinguished from inputs at a second surface of the touch sensor. Each sensing element of the first subset is separated in the lateral direction from at least one sensing element of the second subset. The distance between adjacent sensing elements in the lateral direction may be referred to as a pitch.

The separation distance dz is in a vertical direction that is orthogonal to the lateral and longitudinal directions. For example, the first subset of sensing lines can be formed closer to an intended input surface of the touch sensor and the second subset of sensing lines can be formed further from the intended input surface. For instance, the second subset of sensing lines can be formed closer to a second surface of the touch sensor that is adjacent to the body of a user when a wearable garment or other interactive object including the touch sensor is worn by the user. The distance between the first subset of sensing lines and the second subset of sensing lines can provide a differentiable capacitive output of the touch sensor in response to touch inputs that are received at the intended input surface and the second surface, respectively. In this manner, the touch sensor can differentiate between intentional inputs provided by a user at the intended input surface and unintentional inputs caused by movement of the touch sensor relative to the user's body when the wearable garment is worn by the user.

Figure 7:
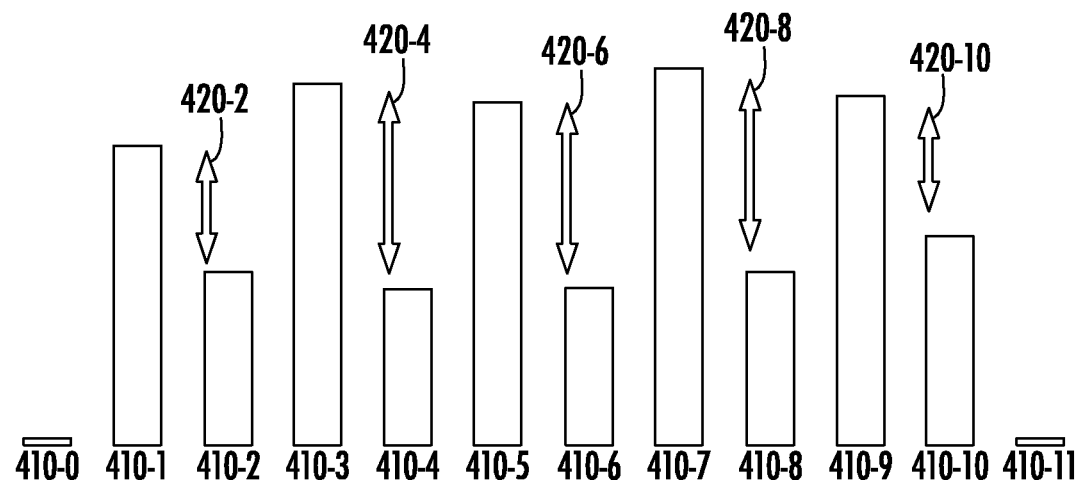
FIG. 7 is a graphical diagram depicting an example sensor response to a touch input at a first surface of a touch sensor in accordance with example embodiments of the present disclosure.

FIG. 7 is a graphical diagram 412 depicting an example of a sensor response to a touch input at a first surface of a touch sensor in accordance with example embodiments of the present disclosure. FIG. 7 depicts a respective output signal associated with each sensing element 410 when the touch input is provided at the first surface of the touch sensor. The signal of associated with each sensing element may be indicative of a capacitance or a resistance of a sensing element in example embodiments. The even sensing elements respond with a higher amplitude than the odd sensing elements. The signal amplitude of each even sensing element is higher than the signal amplitude of each odd sensing element. The signal amplitude may be indicative of a capacitance value or a resistance value in example embodiments. Notably, the capacitance value of each even sensing element is greater than the capacitance value of each odd sensing element that is adjacent to the even sensing element. FIG. 7 depicts the signal difference 420 (e.g., capacitance) between each even sensing element and an adjacent odd sensing element. The signal difference between a particular sensing element of a first subset relative to at least one adjacent sensing element of a second subset may be indicative of a surface at which a touch input is received. By way of example, a signal difference 420-2 represents the signal difference between even sensing element 410-2 and odd sensing element 410-1. The signal difference values may be notable as touch inputs may be received at less than all of the sensing elements in some instances. Accordingly, it may be useful when distinguishing touch inputs to examine a particular sensing line of a subset relative to its closest neighboring sensing lines of another subset.

Figure 8:
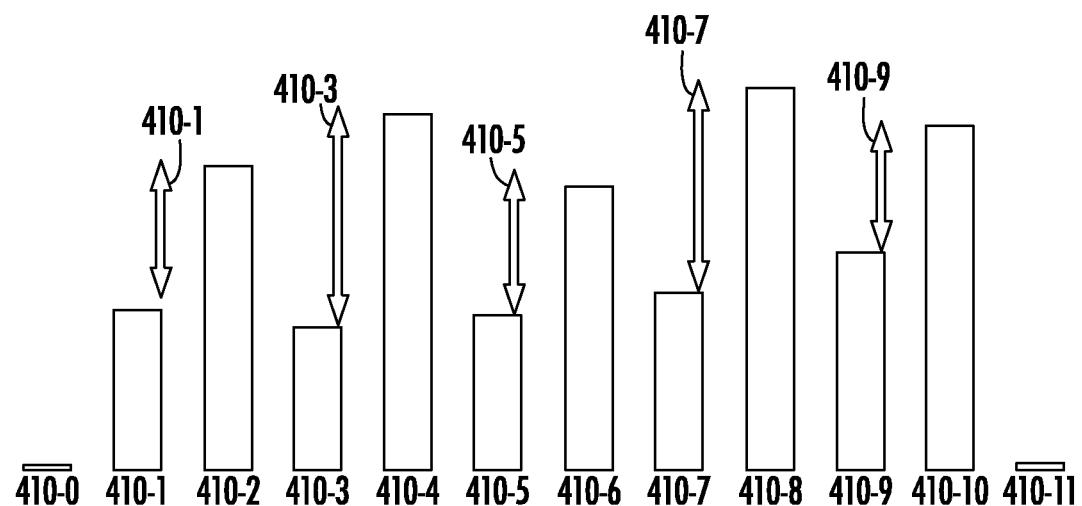
FIG. 8 is a graphical diagram depicting an example sensor response to a touch input at a second surface of a touch sensor in accordance with example embodiments of the present disclosure.

FIG. 8 is a graphical diagram 414 depicting an example sensor response to a touch input at a second surface of a touch sensor in accordance with example embodiments of the present disclosure. FIG. 8 depicts the output signal associated with each sensing element 410 when the touch input is provided at the second surface of the touch sensor. The odd sensing elements respond to the touch input with a higher amplitude. The signal amplitude of each odd sensing element is higher than the signal amplitude of each even sensing element in FIG. 8. Notably, the capacitance value of each odd sensing element is greater than the capacitance value of each adjacent even sensing element. FIG. 8 depicts a signal difference 430 between each odd sensing element and an adjacent even sensing element. By way of example, a signal difference 430-2 represents the signal difference between even sensing element 410-2 and odd sensing element 410-1.

The gesture manager can examine the signal output associated with the sensing elements to determine or classify a touch input as being associated with a particular surface of the touch sensor. For example, the sensor system can determine whether one or more responses associated with a first subset of sensing elements is higher than one or more responses associated with a second subset of sensing elements. If the one or more responses of the first subset are higher, the sensor system can associate the touch input with a first surface of the touch sensor. If, however, the one or more responses of the second subset are higher, the sensor system can associate the touch input with a second surface of the touch sensor.

By way of example, the sensor system can determine at least one signal difference associated with the first subset of conductive sensing elements and determine at least one signal difference associated with the second subset of conductive sensing elements. The sensor system can determine that the touch input is associated with the first subset of conductive sensing elements if the at least one signal difference associated with the first subset of conductive sensing elements is greater than the at least one signal difference associated with the second subset of conductive sensing elements. The sensor system can determine that the touch input is associated with the second subset of conductive sensing elements if the at least one signal difference associated with the second subset of conductive sensing elements is greater than the at least one signal difference associated with the first subset of conductive sensing elements.

Figure 9:
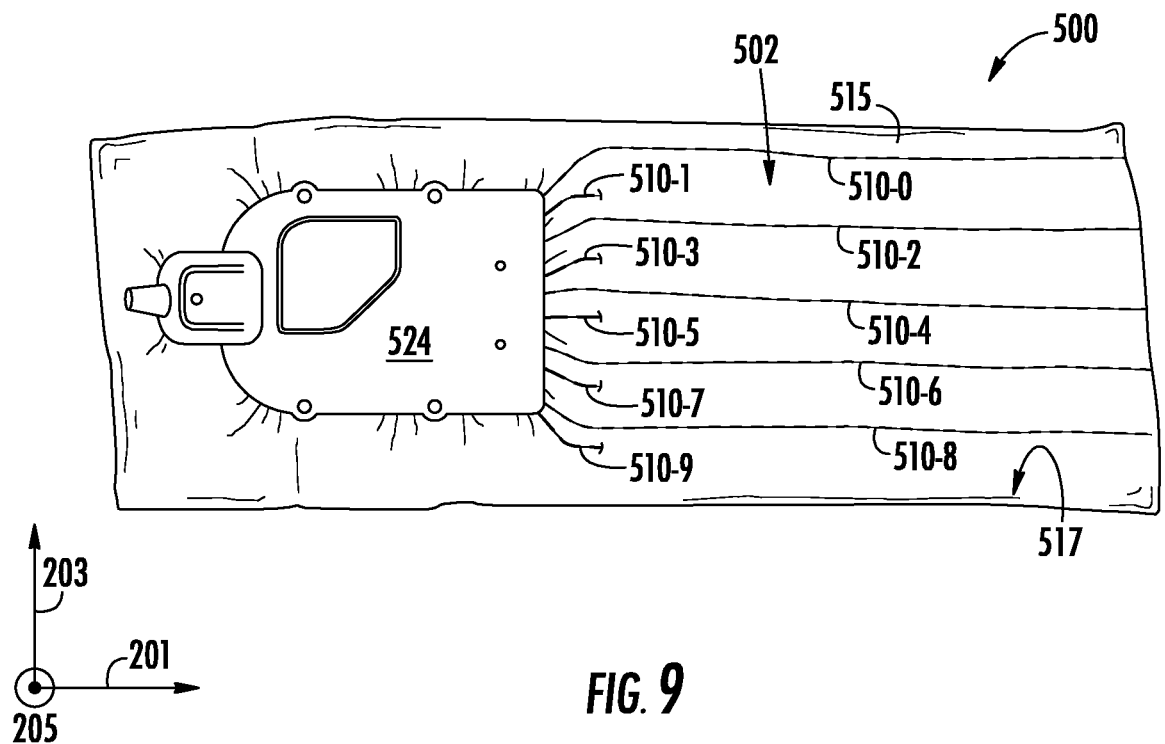
FIGS. 9 and 10 are top and bottom views, respectively, depicting an example of a touch sensor including individual subsets of sensing lines coupled to opposite sides of a flexible substrate in accordance with example embodiments of the present disclosure.
Figure 10:
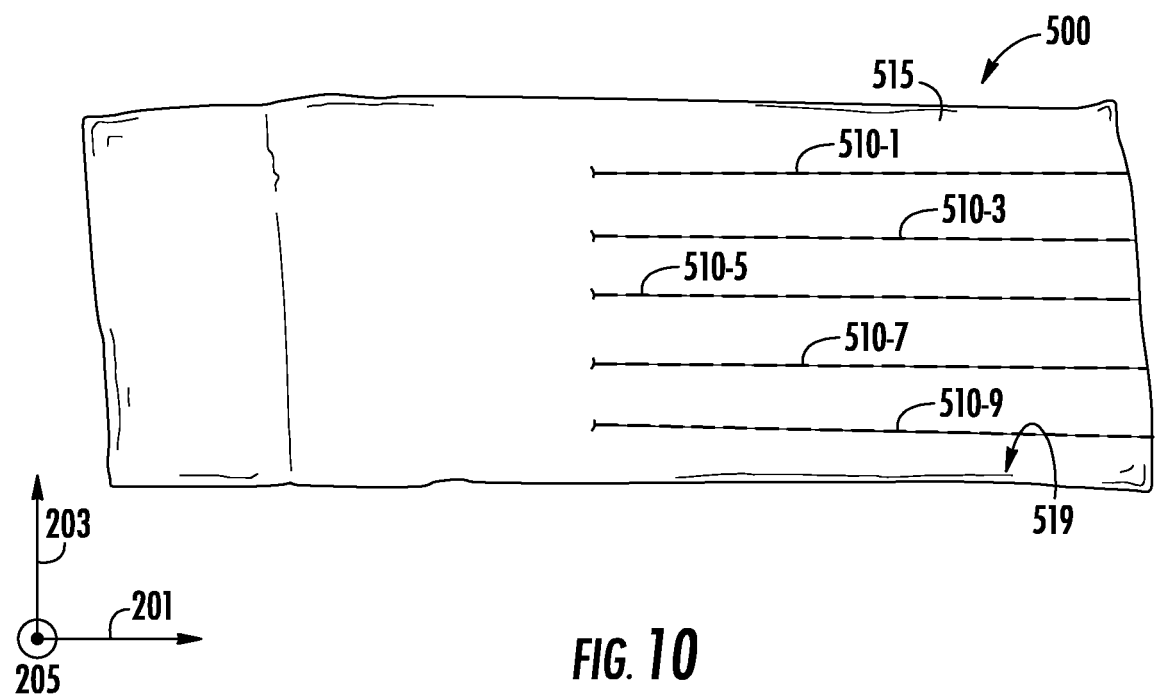

FIG. 9 and FIG. 10 are top and bottom views, respectively, depicting an example of a touch sensor including individual subsets of sensing lines coupled to opposite sides of a flexible substrate in accordance with example embodiments of the present disclosure. A sensor assembly 500 includes a touch sensor 502 and an internal electronics module 524. Internal electronics module 524 is one example of an internal electronics module 124 as depicted in FIG. 2. Touch sensor 502 is one example of a touch sensor 102 as illustrated in FIGS. 1 and 2, and can be configured as a capacitive touch sensor or resistive touch sensor in example embodiments.

Touch sensor 502 is formed from a plurality of conductive threads 510-0 to 510-9. Conductive threads 510-0 to 510-9 are one example of sensing elements 110. Conductive threads 510-0 to 510-9 are an example of parallel sensing lines coupled to a substrate and extending in a longitudinal direction to receive touch input. Internal electronics module 524 may include sensing circuitry (not shown) in electrical communication with the plurality of conductive threads 510-0 to 510-9. Internal electronics module 524 may include one or more communication ports that can couple to a communications cable to provide communication with a removable electronics module. A communication port can additionally or alternatively be coupled to a communication cable to provide communication with various input and/or output devices. Output devices may include an audible output device such as a speaker, a visual output device such as a light (e.g., LED), or a haptic output device such as a haptic motor. Any suitable type of output device may be provided as output device.

The set of conductive threads 510 can be woven or otherwise integrated with a plurality of non-conductive threads to form an interactive textile substrate 515. More particularly, the conductive threads 510 can be formed on opposite sides of substrate 515. A first subset of conductive threads 510-0, 510-2, 510-4, 510-6, and 510-8 can be woven with or otherwise coupled to the first side 517 of the interactive textile and the second subset of conductive threads 510-1, 510-3, 510-5, 510-7, and 510-9 can be woven with or otherwise coupled to the second side 519 of the interactive textile. The first subset of conductive threads can be formed on the first side 517 adjacent to a first surface of the touch sensor and the second subset of conductive threads can be formed on the opposite side 519 adjacent to a second surface of the touch sensor. A touch input to the touch sensor can be detected by the plurality of conductive threads using sensing circuitry of internal electronics module 524 connected to the one or more conductive threads. The sensing circuitry can generate touch data (e.g., raw sensor data or data derived from the raw sensor data) based on the touch input. The sensing circuitry and/or other control circuitry (e.g., a local or remote processor) can analyze the touch data to determine a surface of the touch sensor associated with the touch input. In some examples, the control circuitry can ignore touch inputs associated with the second surface, while analyzing touch inputs associated with the first surface to detect one or more predetermined gestures. As another example, the control circuitry can analyze touch inputs associated with the first surface for a first set of predetermined gestures and can analyze touch inputs associated with the second surface for a second set of predetermined gestures.

With reference to FIG. 9, the first side 517 of flexible substrate 515 can correspond to an intended touch input surface for the touch sensor when integrated with an interactive object. For example, sensor assembly 500 can be integrated with an object to form an interactive object having a touch input surface adjacent to the first side 517 of substrate 515. The second side 519 depicted in FIG. 10 can be adjacent to a user's body when an interactive garment incorporating the sensor assembly is worn by the user.

Conductive threads 510-0 to 510-9 can be formed on or within the textile-based substrate 515. By way of example, textile-based substrate 515 may be formed by weaving, embroidering, stitching, or otherwise integrating conductive threads 510-0 to 510-9 with a set of nonconductive threads.

The conductive threads are coupled to a connecting ribbon 514 in some examples, which can be utilized to position the conductive lines for connection to a plurality of electrical contact pads (not shown) of internal electronics module 524. The plurality of conductive threads 510-0 to 510-9 can be collected and organized using a ribbon with a pitch that matches a corresponding pitch of connection points of an electronic component such as a component of internal electronics module 524. It is noted, however, that a connecting ribbon is not required.

The first subset of conductive threads 510-0, 510-2, 510-4, 510-6, and 510-8 extend from the connecting ribbon 514 in the direction of longitudinal axis 201 with a spacing therebetween in the lateral direction. More particularly, the first subset of conductive threads is coupled to the first side 517 of flexible substrate 515. The first subset of conductive threads can be coupled to the first side of the flexible substrate using any suitable technique. For example, flexible substrate 515 can be formed by weaving nonconductive threads with conductive threads 510. In another example, the first subset of conductive threads 510 can be embroidered to the first side of flexible substrate 515. Other techniques such as gluing, heat pressing, or other fastening techniques may be used.

The second subset of conductive threads 510-1, 510-3, 510-5, 510-7, and 510-9 extend from the connecting ribbon 514 on the first side 517 of the flexible substrate for a limited distance. The second subset of conductive threads extend through the flexible substrate such that they are at least partially exposed on the second side 519 of the flexible substrate. In some examples, the portion of the second subset of conductive threads at the first side can be loose or otherwise not coupled to the flexible substrate 515. In other examples the second subset of conductive threads can be attached to the first side of flexible substrate 515 before passing through the flexible substrate to the second side 519. At the second side 519, conductive threads 510-1, 510-3, 510-5, 510-7, and 510-9 extend in the longitudinal direction. The second subset of conductive threads can be coupled to the second side of the flexible substrate using any suitable technique such as those earlier described with the first step such of conductive threads.

A similar pre-fabricated sensor assembly may additionally or alternatively include other types of sensors. For example, a capacitive touch sensor utilizing a thin film conductive materials may be utilized in place of conductive thread. In some examples, resistive touch sensors can be formed in a similar manner to capacitive touch sensors as described.

FIG. 11 and FIG. 12 are top and bottom views, respectively, depicting another example of a sensor assembly 550 including a touch sensor 552. Touch sensor 552 includes individual subsets of sensing lines coupled to opposite sides of flexible substrate 565 in accordance with example embodiments of the present disclosure. Sensor assembly 550 includes a touch sensor 552 and an internal electronics module 524. Touch sensor 552 is one example of a touch sensor 102 as illustrated in FIGS. 1 and 2, and can be configured as a capacitive touch sensor or resistive touch sensor in example embodiments.

FIG. 11 is a top perspective view depicting a first side 567 of flexible substrate 565 which can correspond to an intended touch input surface for the touch sensor when integrated with an interactive object. FIG. 12 depicts a second side 569 of the flexible substrate which can be adjacent to a user's body when an interactive garment incorporating the sensor assembly is worn by the user. In this example, the first side 567 of the flexible substrate includes a first substrate layer and the second side of the flexible substrate includes a second substrate layer. An opening is formed between the substrate layers. A first subset of conductive threads 560-0, 560-2, 560-4, 560-6, and 560-8 extend from the connecting ribbon 564 in the longitudinal direction and are coupled to the first side 567 of flexible substrate 565. The first subset of conductive threads can be coupled to the first substrate layer using any suitable technique.

The second subset of conductive threads 560-1, 560-3, 560-5, 560-7, and 560-9 extends through the flexible substrate to be at least partially exposed on the second side 569 of the flexible substrate. Conductive threads 560-1, 560-3, 560-5, 560-7, and 560-9 extend in the longitudinal direction and are coupled to the second substrate layer at the second side 519. The second subset of conductive threads can be coupled to the second side of the flexible substrate using any suitable technique.

As FIGS. 11 and 12 illustrate, the first and second substrate layers can be separated in the vertical direction (e.g., along the vertical axis 205) which is orthogonal to the first side and the second side of the flexible substrate. In some examples, one or more additional layers can be positioned between the first side and the second side of the flexible substrate. For instance, one or more insulating materials may be formed as part of the flexible substrate to provide insulation between the first subset of conductive threads and the second subset of conductive threads. An insulating material may increase the signal differentiation between the first and second subsets of sensing elements in response to touch inputs at the respective surfaces of the touch sensors.

As earlier described, touch inputs at the first surface and the second surface of a touch sensor can be differentiated with or without having a vertical separation between the subsets of sensing elements. For example, one or more shielding layers may be used where a vertical separation is not necessarily provided between the subsets of sensing elements. In some examples, one or more insulating materials may be formed as part of a flexible substrate to provide a shielding layer that includes insulation between the first subset of conductive threads and the second subset of conductive threads. For example, one or more insulating layers having a low dielectric constant can be used. A material may be used that provides partial attenuation of signals in some instances. A material can provide some signal attenuation of signals associated with the subset of lines opposite to a touch input. Nevertheless, a change in capacitance of the lines on the opposite side can still be detected in order to detect movements and gestures.

Figure 13:
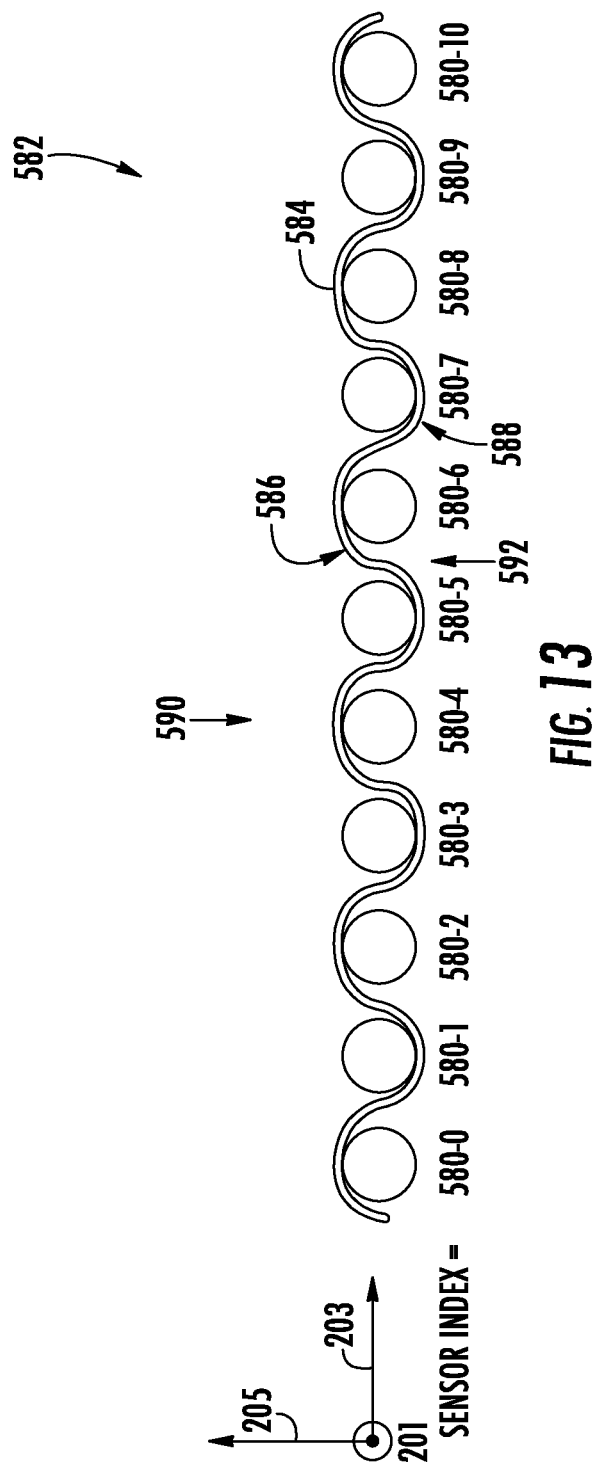
FIG. 13 is a cross-sectional view depicting an example set of sensing elements formed in a single plane with an intervening layer formed between individual subsets of sensing lines in accordance with example embodiments of the present disclosure.

FIG. 13 is a cross-sectional view depicting a sensor system having a touch sensor 582 including an example set of sensing elements 580 formed in a single plane with an intervening layer formed between individual subsets of sensing elements in accordance with example embodiments of the present disclosure. The flexible substrate 584 forms an S-shaped pattern whereby the substrate separates the subsets of conductive threads without creating a distance between the conductive threads in the vertical direction. Nevertheless, the flexible substrate can provide shielding between the first subset of conductive threads and the second subset of conductive threads such that touch inputs at a first surface of the touch sensor can be differentiated from touch inputs at a second surface of the touch sensor. A first subset of conductive sensing elements 580-0, 580-2, 580-4, 580-6, 580-8, and 580-10 and a second subset of sensing elements 580-1, 580-3, 580-5, 580-7, and 580-9 can be formed in the same plane, without a vertical spacing therebetween. The first subset of conductive sensing elements can be coupled to a first side 588 of the flexible substrate 584 and the second subset of conductive sensing elements can be coupled to a second side 586 of the flexible substrate 584. Touch inputs at a first surface 590 of the touch sensor 582 and the second surface 592 can be differentiated with or without having a vertical separation between the subsets of conductive threads. In some examples, one or more insulating materials may be formed as part of the flexible substrate 584 to provide insulation between the first subset of conductive threads and the second subset of conductive threads.

A touch input provided adjacent to a first surface 590 may result in a higher signal output by the odd sensing elements relative to the even sensing elements. The odd sensing elements are exposed (e.g., not covered) at the first surface 590. By contrast, the even sensing elements are covered by the flexible substrate 584 at the first surface 590. A touch input provided adjacent to a second surface 592 may result in a higher signal output by the even sensing elements relative to the odd sensing elements. The even sensing elements are exposed (e.g., not covered) at the second surface 592. By contrast, the odd sensing elements are covered by the flexible substrate 584 at the second surface 592. Accordingly, a higher signal output associated with the even sensing lines may be indicative of a touch input at the second surface 592. A higher signal output associated with the odd sensing lines may be indicative of a touch input at the first surface 590.

Figure 14:
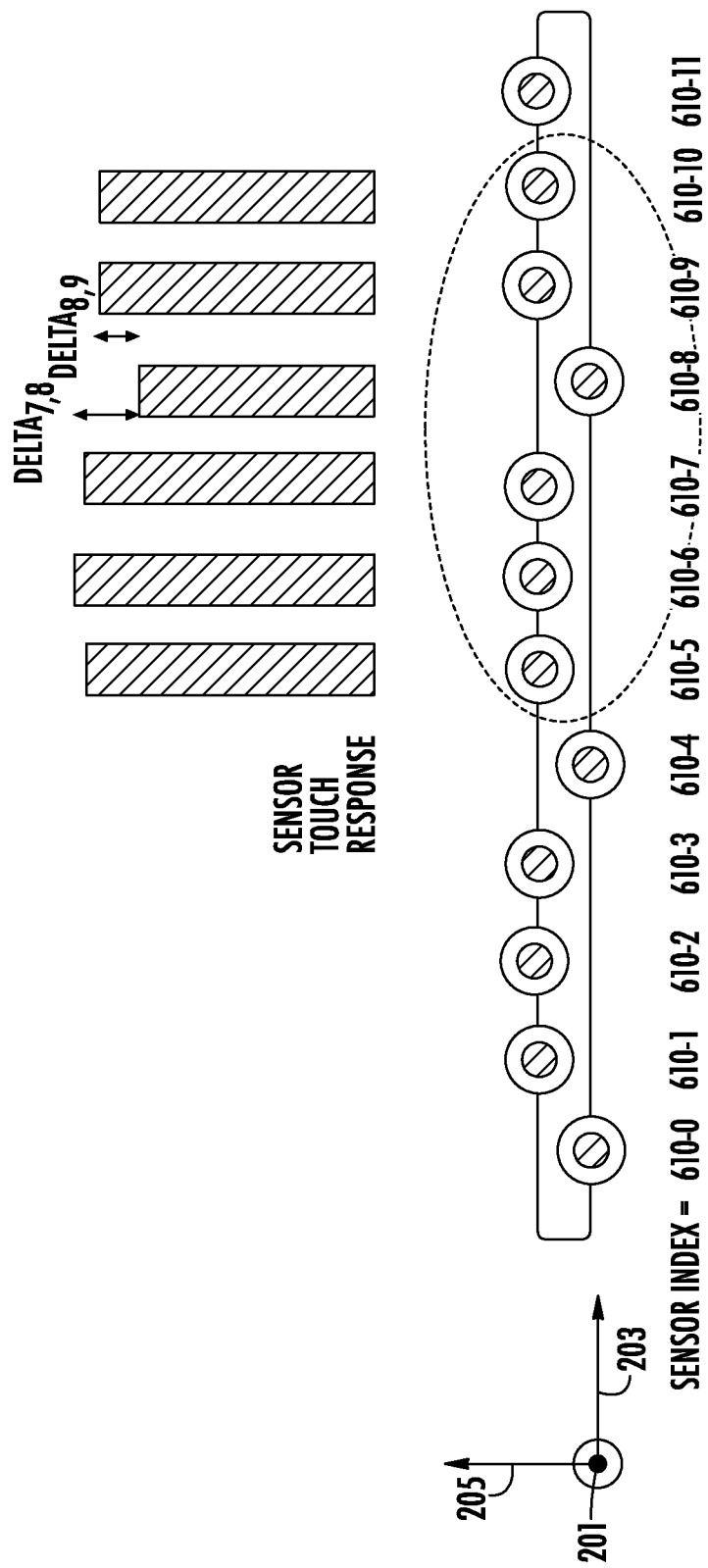
FIG. 14 is a graphical diagram illustrating a set of sensing elements formed in multiple planes with an unequal number of sensing lines in each plane in accordance with example embodiments of the present disclosure.

In some examples, an unequal number of sensing lines can be formed on each side of a flexible substrate. FIG. 14 is a graphical diagram depicting a set of sensing elements 610 including an unequal number of sensing elements for individual subsets of sensing elements in accordance with example embodiments of the present disclosure. FIG. 14 depicts a cross-sectional view of the conductive sensing elements 610, illustrating a vertical separation dz along the vertical axis 205 between the first subset 640 of sensing elements 610-0, 610-2, 610-4, 610-6, and 610-8 and the second subset 642 of sensing elements 610-1, 610-3, 610-5, 610-7, and 610-9. The first plane and the second plane are separated in a vertical direction along the vertical axis. The vertical separation or distance dz between the subsets of sensing elements enables inputs at a first surface of the touch sensor to be distinguished from inputs at a second surface of the touch sensor. Each sensing element of the first subset is separated in the lateral direction from at least one sensing element of the second subset.

In this example, the even subset of sensing elements includes fewer sensing elements than the odd subset of sensing elements. Specifically, the even subset of sensing elements includes three sensing elements 610-0, 610-4, and 610-8, whereas the odd subset of sensing elements includes nine sensing elements 610-1, 610-2, 610-3, 610-5, 610-6, 610-7, 610-9, 610-10, and 610-11. It is noted that different numbers of sensing elements may be utilized for the subsets in various implementations. A sensor touch response is illustrated at 608. Specifically, the sensor response of sensing elements 610-5, 610-6, 610-7, 610-8, 610-9, and 610-10 is illustrated. A touch input to the surface of the touch sensor closer to the odd sensing elements is illustrated. The even sensing element 610-8 responds with a smaller signal output than the sensing elements of the odd layer. As illustrated, the signal difference between the even sensing element and its adjacent odd sensing elements may vary in such examples. A first signal difference between sensing elements 610-8 and adjacent sensing element 610-7 is depicted as Delta7,8. A second signal difference between sensing element 610-8 and adjacent sensing element 610-9 is depicted as Delta8,9. The signal difference can be detected and the touch input appropriately classified as being associated with the corresponding touch input surface.

A sensor system in accordance with example embodiments can include a touch sensor and one or more control circuits that are configured to selectively detect input gestures at the touch sensor based on a surface at which the touch inputs are received. The one or more control circuits can include sensing circuitry configured to detect touch inputs to the touch sensor using the one or more sensing elements. The sensing circuitry can generate sensor data based on the touch inputs. The one or more control circuits can additionally or alternatively include one or more processors local to an interactive object and/or one or more processors remote from the interactive object, such as at one or more remote computing devices. The one or more control circuits can implement all or a portion of a gesture manager in example embodiments.

Figure 15:
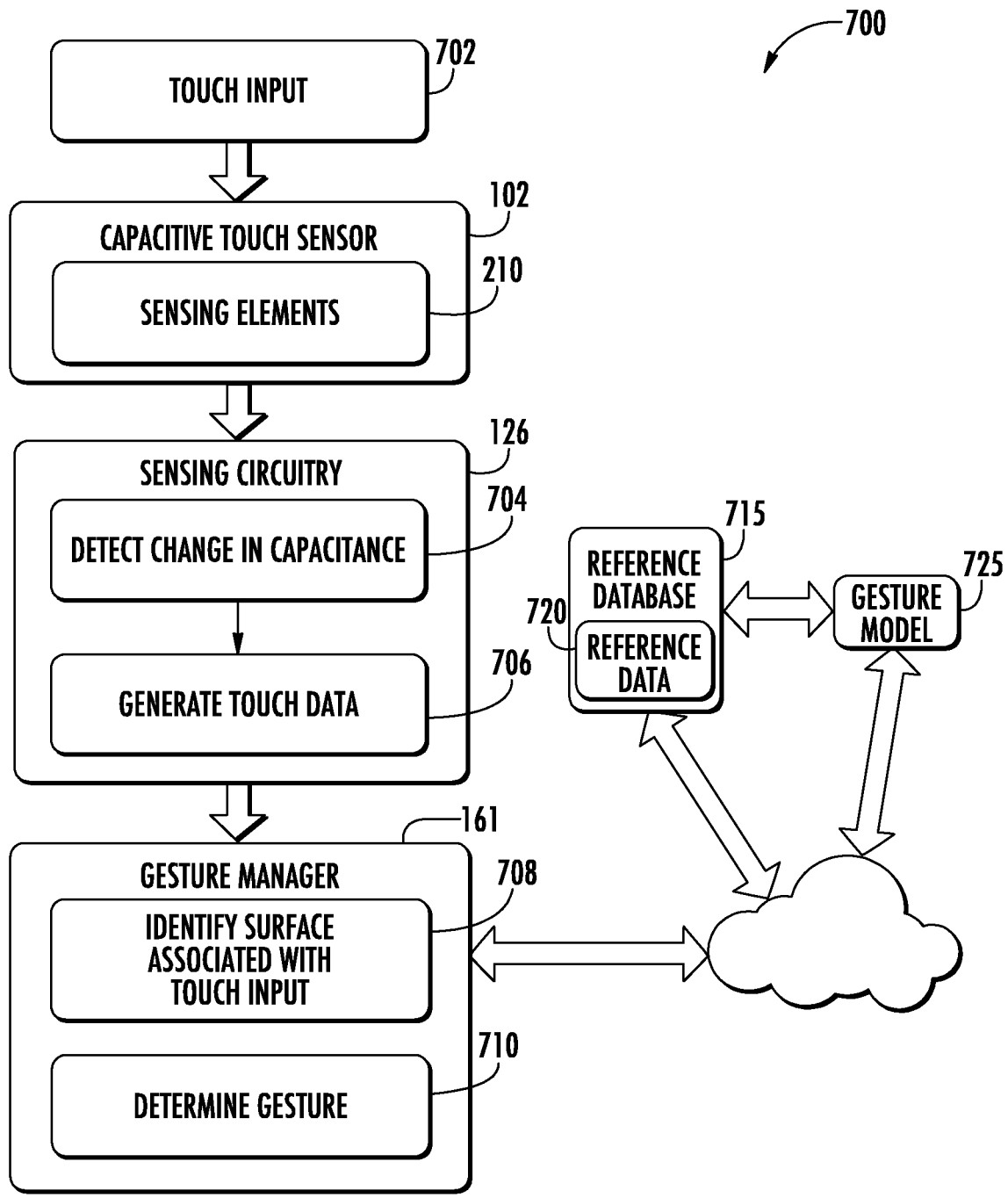
FIG. 15 is a block diagram depicting an example computing environment, illustrating the detection of gestures based on an identified input surface of the touch sensor in accordance with example embodiments of the present disclosure.

FIG. 15 is a block diagram depicting an example computing environment 700, illustrating the detection of gestures based on an identified input surface of a touch sensor in accordance with example embodiments of the present disclosure.

Interactive object 104 and/or one or more computing devices in communication with interactive object 104 can detect a user gesture based at least in part on capacitive touch sensor 102. For example, interactive object 104 and/or the one or more computing devices can implement a gesture manager 161 that can identify one or more gestures in response to touch input 702 to the capacitive touch sensor 102.

Interactive object 104 can detect touch input 702 to capacitive touch sensor 102 based on a change in capacitance associated with a set of conductive threads 210. For example, a user can move an object (e.g., finger, conductive stylus, etc.) proximate to or touch capacitive touch sensor 102, causing a response by the individual sensing elements. By way of example, the capacitance associated with each sensing element can change when an object touches or comes in proximity to the sensing element. As shown at (704), sensing circuitry 126 can detect a change in capacitance associated with one or more of the sensing elements. Sensing circuitry 126 can generate touch data at (706) that is indicative of the response (e.g., change in capacitance) of the sensing elements to the touch input. The touch data can include one or more touch input features associated with touch input 702. In some examples, the touch data may identify a particular element, and an associated response such as a change in capacitance. In some examples, the touch data may indicate a time associated with an element response.

Gesture manager 161 can analyze the touch data to identify the one or more touch input features associated with touch input 702. Gesture manager 161 can be implemented at interactive object 104 (e.g., by one or more processors of internal electronics module 124 and/or removable electronics module 206) and/or one or more computing devices remote from the interactive object 104.

Gesture manager 161 can analyze the touch data at (708) to identify a surface associated with the touch input. By way of example, gesture manager 161 can determine at least one signal difference associated with a first subset of conductive sensing elements adjacent an intended touch input surface and a second subset of conductive sensing element adjacent to at least one second surface. If the signal difference indicates a larger response by the first subset of sensing elements, gesture manager 161 can classify the touch input as associated with the intended touch input surface. If, however, the signal difference indicates a larger response by the second subset of sensing element, gesture manager 161 can classify the touch input is associated with the at least one second surface.

In accordance with some implementations, the one or more control circuits can analyze a respective response such as a resistance or capacitance of each sensing element of the touch sensor to determine whether a touch input is associated with a first surface of the touch sensor or a second surface of the touch sensor. For instance, the control circuits can determine whether at least one capacitance of the first subset of sensing elements is greater than at least one capacitance of the second subset of sensing elements. The at least one capacitance of each subset can include a capacitance associated with individual sensing elements of each subset, an average capacitance associated with each subset, and/or an accumulated capacitance associated with each subset in various implementations.

In some examples, the one or more control circuits can determine whether at least one signal difference associated with the first subset of sensing elements is greater than at least one signal difference associated with the second subset of sensing elements. For instance, a control circuit can determine for each sensor line in the array a signal difference between the capacitance of such sensor line and the capacitance of its adjacent sensor line(s). An accumulated signal difference value for each sensor line in the first subset can be determined by combining (e.g., adding) the signal difference value for each sensing line in the first subset. An accumulated signal difference value for each sensor line in the second subset can be determined by combining the signal difference value for each sensing line in the second subset. The two accumulated signal difference values can be compared. If the accumulated signal difference value for the first subset is larger than the accumulated signal difference value for the second subset, the control circuit can determine that the touch input is received at the first surface of the touch sensor. If the accumulated signal difference value for the second subset is larger than the accumulated signal difference value for the first subset, the control circuit can determine that the touch input is received at the second surface of the touch sensor.

At (710), gesture manager 161 can determine a gesture based at least in part on the touch data. In some examples, gesture manager 161 determines whether the touch data corresponds to a particular gesture only if the touch input is associated with an intended touch input surface. For example, gesture manager 161 may disregard or otherwise ignore touch data associated with an unintended input surface. As described herein, in other examples gesture manager 161 may identify a particular gesture based on the surface of which the touch input is received. For example, a first gesture may be identified in response to a touch input at a first surface while a second gesture may be identified in response to a touch input at a second surface.

In some examples, gesture manager 161 can identify at least one gesture based on reference data 720. Reference data 720 can include data indicative of one or more predefined parameters associated with a particular input gesture. The reference data 720 can be stored in a reference database 715 715 in association with data indicative of one or more gestures. Reference database 915 can be stored at interactive object 104 (e.g., internal electronics module 124 and/or removable electronics module 206) and/or at one or more remote computing devices in communication with the interactive object 104. In such a case, interactive object 104 can access reference database 715 via one or more communication interfaces (e.g., network interface 216).

Gesture manager 161 can compare the touch data indicative of the touch input 702 with reference data 720 corresponding to at least one gesture. For example, gesture manager 161 can compare touch input features associated with touch input 702 to reference data 720 indicative of one or more pre-defined parameters associated with a gesture. Gesture manager 161 can determine a correspondence between at least one touch input feature and at least one parameter. Gesture manager can detect a correspondence between touch input 702 and at least one line gesture identified in reference database 715 based on the determined correspondence between at least one touch input feature and at least one parameter. For example, a similarity between the touch input 702 and a respective gesture can be determined based on a correspondence of touch input features and gesture parameters.

In some examples, gesture manager 161 can input touch data into one or more machine learned gesture models 725. A machine-learned gesture model some 25 can be configured to output a detection of at least one gesture based on touch data and/or an identification of a surface or subset of sensing element associated with a touch input. Machine learned gesture model 725 can generate an output including data indicative of a gesture detection. For example, machine learned gesture model 725 can be trained, via one or more machine learning techniques, using training data to detect particular gestures based on touch data. Similarly, a machine learned gesture model 725 can be trained, via one or more machine learning techniques, using training data to detect a surface associated with a touch input.

Gesture manager 161 can input touch data indicative of touch input 702 and/or into machine learned gesture model 725. One or more gesture models 725 can be configured to determine whether the touch input is associated with a first subset of sensing elements or a second subset of sensing elements. Additionally or alternatively, one or more gesture models 725 can be configured to generate one or more outputs indicative of whether the touch data corresponds to one or more input gestures. Gesture model 725 can output data indicative of a particular gesture associated with the touch data. Additionally, or alternatively, gesture model can output data addictive of a surface associated with the touch data. Gesture model 725 can be configured to output data indicative of an inference or detection of a respective gesture based on a similarity between touch data indicative of touch input 702 and one or more parameters associated with the gesture.

In accordance with examples embodiments, a sensor system can selectively determine whether a touch input corresponds to a particular input gesture based at least in part on whether the touch input is determined to have been received at first surface of the touch sensor or a second surface of the touch sensor. In response to determining that the touch input is associated with the first surface, the sensor system can determine whether the touch data corresponds to one or more gestures or other predetermined movements. For example, the sensor system can compare the touch data with reference data representing one or more predefined parameters to determine if the touch data corresponds to one or more gestures. In response to detecting the first input gesture, the sensor system can initiate a functionality at a computing device. In response to determining that the touch input is associated with the second surface, however, the sensor system can automatically determine that the touch input is not indicative of the particular input gesture such that a functionality is not initiated.

In some implementations, a touch input at a first surface of the touch sensor can be associated with a first input gesture while the same or a similar touch input at a second surface of the touch sensor can be associated with a second input gesture. For example, the sensor system can determine whether touch data generated in response to a touch input is associated with the first surface of the touch sensor or the second surface of the touch sensor. Additionally, the sensor system can determine whether the touch data corresponds to one or more predefined parameters. If the touch data corresponds to the one or more predefined parameters and is associated with the first surface, the sensor system can determine that a first input gesture has been performed. If, however, the touch data corresponds to the one or more predefined parameters and is associated with the second surface, the sensor system can determine that a second input gesture has been performed. By differentiating the surface at which an input is received, the sensor system can detect a larger number of input gestures in example embodiments.

Interactive object 104 and/or a remote computing device in communication with interactive object 104 can initiate one or more actions based on a detected gesture. For example, the detected gesture can be associated with a navigation command (e.g., scrolling up/down/side, flipping a page, etc.) in one or more user interfaces coupled to interactive object 104 (e.g., via the capacitive touch sensor 102, the controller, or both) and/or any of the one or more remote computing devices. In addition, or alternatively, the respective gesture can initiate one or more predefined actions utilizing one or more computing devices, such as, for example, dialing a number, sending a text message, playing a sound recording etc.

Figure 16:
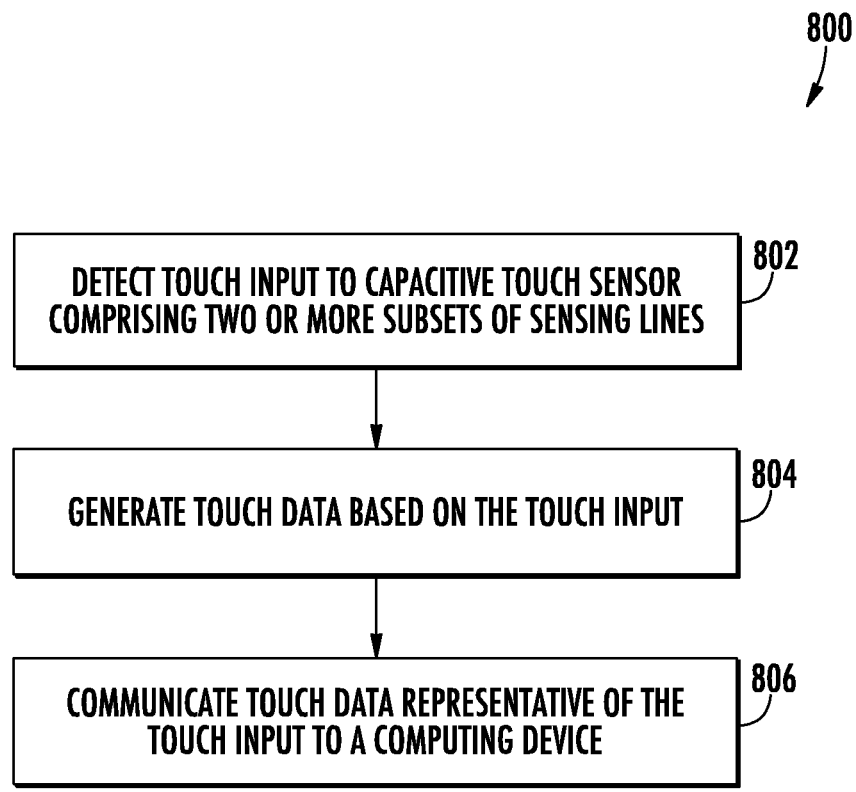
FIG. 16 is a flowchart depicting an example process of generating touch data in response to touch input detected by a touch sensor in accordance with example embodiments of the present disclosure.
Figure 17:
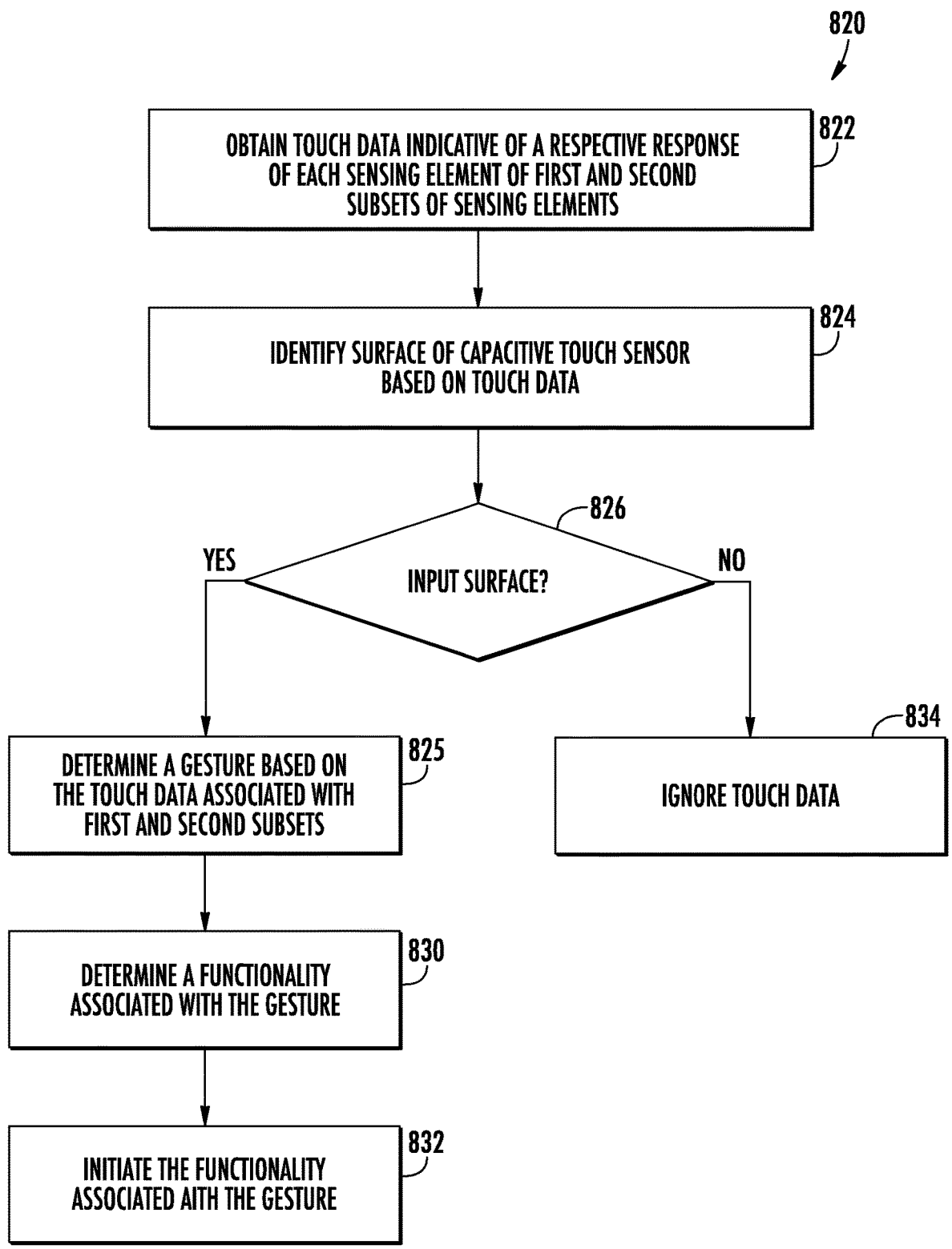
FIG. 17 is a flowchart depicting an example process of selectively identifying a gesture and initiating a functionality based on an identified input surface of a touch sensor in accordance with example embodiments of the present disclosure.
Figure 19:
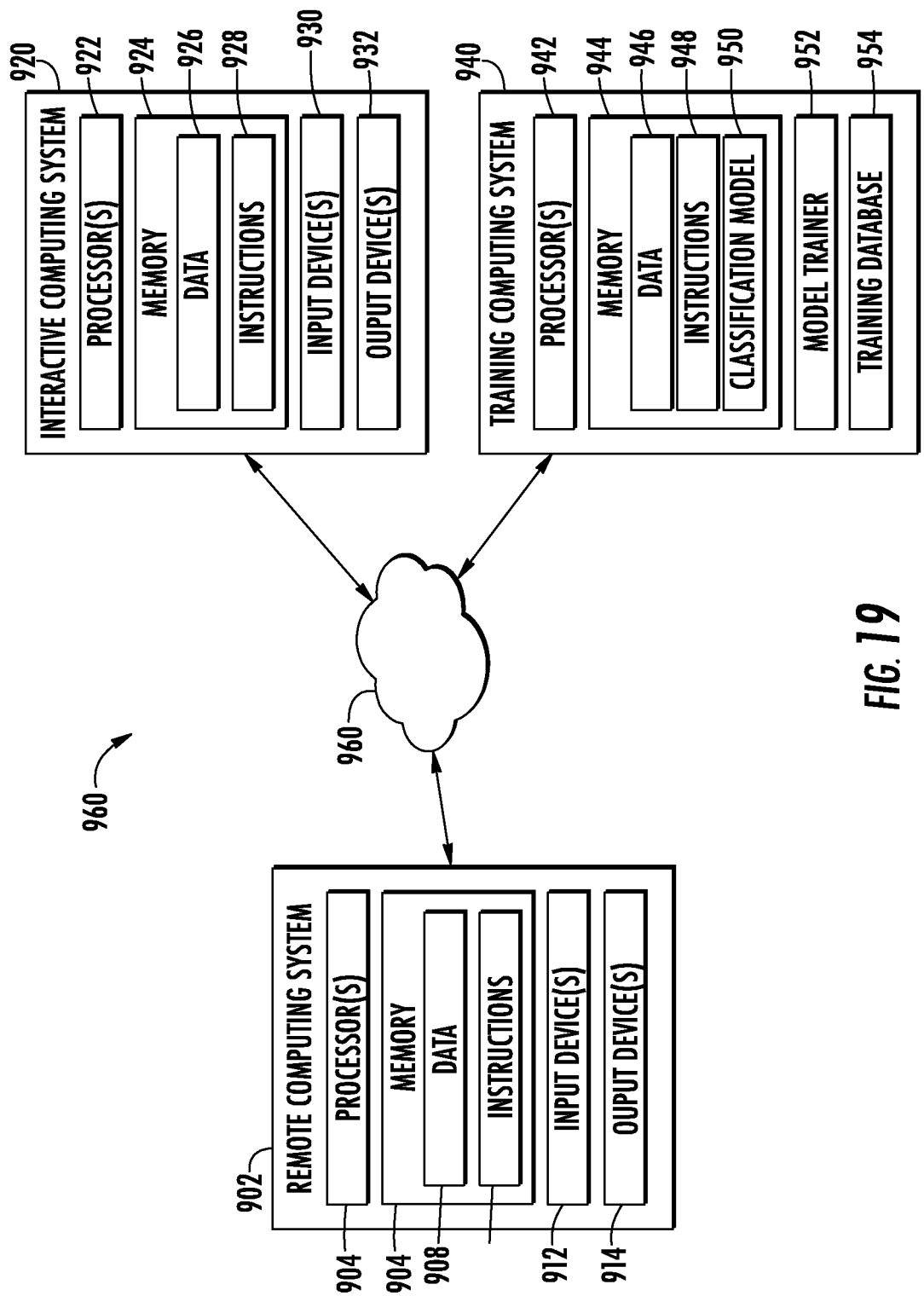
FIG. 19 depicts a block diagram of an example computing system that can be used to implement example embodiments in accordance with the present disclosure.

FIGS. 16 and 17 illustrate an example method 800 (FIG. 16) of generating touch data using an interactive object, and an example method 820 (FIG. 17) of determining gestures or other motions usable to control a computing device or applications at the computing device based on touch data received from an interactive object. These methods and other methods herein are shown as sets of blocks that specify operations performed but are not necessarily limited to the order or combinations shown for performing the operations by the respective blocks. One or more portions of method 800, and the other processes described herein (method 820 and/or method 850), can be implemented by one or more computing devices such as, for example, one or more computing devices of a computing environment 100 as illustrated in FIG. 1, computing system 190 as illustrated in FIG. 2, computing system 200 as illustrated in FIG. 3, or a computing environment 900 as illustrated in FIG. 19. While in portions of the following discussion reference may be made to a particular computing environment, reference to which is made for example only. The techniques are not limited to performance by one entity or multiple entities operating on one device. One or more portions of these processes can be implemented as an algorithm on the hardware components of the devices described herein.

At (802), method 800 can include detecting a touch input to an interactive object. Block 802 may include detecting touch-input to a set of sensing elements such as conductive threads woven into an interactive textile or otherwise attached to a flexible substrate. The set of sensing elements can include a first subset of sensing elements that are separated vertically from a second subset of sensing elements. Additionally or alternatively, the first subset of sensing elements can be coupled to a first side of a flexible substrate and the second subset sensing elements can be coupled to a second side of the flexible substrate. By way of example, sensing circuitry 126 (FIG. 2) can detect touch-input to a set of sensing elements 110 forming a touch sensor 102 (FIG. 1) when an object, such as a user's finger, touches or is proximate to touch sensor 102.

At (804), touch data is generated based on the touch-input. For example, sensing circuitry 126 can generate sensor data such as touch data based on the touch-input. The touch data may include respective signal values (e.g., capacitance or resistance) associated with the set of sensing elements 110. To detect the touch-input and/or a position of the touch input, sensing circuitry 126 can use self-capacitance sensing, projective capacitance sensing, or other techniques At (806), the touch data is communicated to a computing device to control the computing device or one or more applications at the computing device. For example, communication interface 162 at object 104 can communicate the touch data generated by sensing circuitry 126 to gesture manager 161 implemented at removable electronics module 150. Gesture manager 161 may be implemented at object 104, in which case communication interface 162 may communicate the touch data to gesture manager 161 via a wired connection. Additionally or alternatively, gesture manager 161 may be implemented remote from object 104, in which case network interface 156 may communicate the touch data to gesture manager 161 via network 108. It is noted that the movement data such as touch data may include various types of data. For example, the movement data may include raw sensor data in some examples. In other examples, the touch data may include data indicative of a motion, gesture, or intermediate representation of the sensor data as has been determined by the object (e.g., by microprocessor 128 and/or microprocessor 152).

Optionally, the interactive garment can be controlled to provide feedback indicating detection of the touch-input or triggering of the functionality. For example, sensing circuitry 126 can control one or more output devices at the interactive object to provide feedback indicating the touch-input was detected, such as by controlling a light source to blink or controlling a vibration component to vibrate. As another example, sensing circuitry 126 can control one or more output devices to provide feedback indicating that a particular function has been triggered. For instance, an LED can be integrated into the sleeve of an interactive garment, and is controlled to output light (e.g., by blinking) in response to detecting the touch-input or in response to confirming that the touch-input caused the particular functionality to be triggered. An LED can be integrated into an external module in some cases. Other output devices including visual, audible, and haptic output devices can be integrated into an interactive object or external module.

FIG. 17 illustrates an example method 820 of determining predefined motions such as gestures usable to control a computing device or applications at the computing device based on touch data received from an interactive object. Method 820 includes initiating a functionality that is triggered by user interaction with an interactive object. The computing device may be local to the interactive object, such as incorporated within a garment or object, or may be remote to the interactive object, such as a smartphone or a remote computing device such as a server.

At (822), touch data indicative of a respective response of each sensing element of a first and second subset of sensing elements is obtained. For example, a network interface at a computing device 106 can receive touch data from network interface 216 at interactive object 104 that is communicated to gesture manager 161 in one example. If gesture manager 161 is implemented at the interactive object, the movement data may be received by an internal electronics module or removable electronics module of the interactive object.

At (824), method 820 can include identifying the surface of the touch sensor on the touch data. By way of example, gesture manager 161 can determine at least a first respective response by a first conductive sensing element of the first subset and a second respective response by a second conductive sensing element of the second subset. The gesture manager can determine whether the touch input is associated with a first surface of the touch sensor or a second surface of the touch sensor based at least in part on the first respective response and the second respective response. In some examples, an accumulated signal difference associated with the first subset of sensing element an accumulated signal difference associated with a second subset of sensing element can be used to determine a surface of the touch sensor associated with touch input. In some examples, one or more machine-learned models can be configured to determine whether a touch input is associated with an intended input surface or a second surface of a touch sensor. Touch data can be provided as one or more inputs to the machine-learned model which can provides as one or more outputs an indication of particular input surface and/or subset of sensing elements based on the touch data.

At 826, method 820 can include determining whether the surface associated with the touch input is intended input surface of the touch sensor. For example, gesture manager 161 can determine whether the touch input is associated with a first subset of conductive sensing elements or a second subset of conductive sensing elements. The first subset of conductive sensing elements may be adjacent to the intended input surface, and the second subset of conductive sensing elements may be adjacent to one or more second surfaces of the touch sensor. If the touch input is associated with the intended input surface of the touch sensor, method 820 proceeds at 828.

At 828, method 820 can include determining whether the touch data is indicative of a predetermined motion such as a gesture. For example, gesture manager 161 can identity a predefined motion such as a gesture based on the touch data, such as single-finger touch gesture, a double-tap gesture, a two-finger touch gesture, a swipe gesture, and so forth. In some embodiments, gesture manager 161 can determine whether the touch data corresponds to one or more predefined parameters associated with the first input gesture. It is noted that the response of sensing elements from the first subset of sensing element adjacent to the intended input surface as well as the response of sensing elements adjacent to the user's body can be used in determining a gesture at 825. That is, while a particular subset of sensing elements may be associated with a touch input in order to identify particular surface of the touch sensor, the entire set of sensing elements can be used to detect gestures.

Various techniques can be used to detect gestures in accordance with example embodiments of the present disclosure. The sensor system can determine whether touch data corresponds to one or more predefined parameters associated with a particular input gesture in some examples.

The interactive object and/or a computing device in communication with the interactive object can detect a correspondence between a touch input and at least one gesture. For example, one or more features of the touch data that correspond to one or more of the predefined parameter(s) for at least one gesture can be identified. By way of example, a correspondence between features and parameters can be identified using matching criteria. A similarity between touch data and a respective gesture can be determined. For example, the similarity between the touch input and the respective gesture can be determined based on a number of corresponding features and parameters. In some examples, a correspondence between the touch data and a respective gesture can be detected based on a respective gesture associated with the largest number of corresponding features and parameters.

The one or more predefined parameters can be stored in a reference database with an identification of a respective gesture in example embodiments. The sensor system can compare the touch data with the one or more predefined parameters to determine whether the particular input gesture has been performed. Examples of pre-defined parameters can include sensing, motion, or other detection parameters. Features of the touch data such as capacitance levels, resistance levels, line activation orders, a number of elements having a capacitance change, etc. can be compared to the pre-defined parameters in some examples. The sensor system can detect the first input gesture in response to the touch data corresponding to the predefined parameters and the touch input being associated with the first surface.

Additionally or alternatively, touch data generated by an interactive object can be input into one or more machine-learned models (e.g., a machine-learned classification model) to detect a surface at which the corresponding touch input was received, and/or to detect one or more predefined gestures. Data indicative of particular surface of the touch sensor and/or data indicative of the detection of a predetermined gesture can be generated as the output of the one or more machine-learned models.

By way of example, a machine-learned classification model can include one or more neural networks (e.g., deep neural networks, convolutional neural networks) or other multi-layer non-linear models. The model(s) can be trained, via one or more machine learning techniques, using training data. The training data can include touch data previously collected by one or more interactive objects at a first surface of a touch sensor and a second surface of a touch sensor. By way of example, one or more interactive objects can generate touch data based on one or more touch inputs associated with a user of the one or more interactive objects. The training data can be labeled to identify a particular surface and/or gesture corresponding to the movement data. The machine-learned classification model can be trained using various training or learning techniques, such as, for example, backwards propagation of errors based on the labeled training data.

In this manner, the machine-learned classification model can be trained to detect particular gestures associated with particular surfaces of a touch sensor based on touch data. In some implementations, touch data can be input into the machine-learned classification model. The machine-learned classification model can ignore touch inputs associated with an unintended surface of the touch sensor in some examples. The machine-learned classification model can generate data indicative of a particular gesture if the touch input is received at an intended input surface and if the touch data touch data matches or otherwise indicates a correspondence with the particular gesture. In other examples, the machine-learned classification model can generate data indicative of a first gesture in response to touch data that is associated with a first surface of the touch sensor and that matches or otherwise indicates a correspondence with the first gesture. The machine-learned classification model can generate data indicative of a second gesture in response to touch data that is associated with a second surface of the touch sensor and that matches or otherwise indicates a correspondence with the second gesture. In some examples, the same or similar touch data received at different surfaces can correspond to different gestures.

By way of example, the machine-learned classification model can include a machine-learned binary classifier model. The model can classify the touch data in a binary manner, such as to indicate whether the touch data is associated with a first surface of the touch sensor (e.g., "1") or whether the touch data is associated with a second surface of the touch sensor (e.g., "0"). Similarly, a machine learned classification model can include a machine learned binary classifier model that can classify touch data as indicative of a particular gesture (e.g., "1") or as not indicative of a particular gesture (e.g., "0").

In some implementations, gesture manager 161 can determine whether touch data corresponds to one or more predefined parameters associated with an input gesture by providing the touch data as one or more inputs to one or more machine-learned models. The machine-learned model(s) can generate one or more outputs indicative of whether the one or more inputs correspond to the first input gesture. In some examples, the one or more machine-learned models are configured to generate the one or more outputs indicative of whether the one or more outputs correspond to the first input gesture based at least in part on whether the touch input is associated with the first subset of conductive sensing elements or the second subset of conductive sensing elements.

At (830), method 820 can include determining a functionality associated with the predefined motion. In some examples, gesture manager 161 determines whether the touch data corresponds to a request to perform a particular functionality. For example, gesture manager 161 can determine whether the touch data corresponds to a user input or gesture that is mapped to a particular functionality, such as triggering an output response such as an audible output associated with a text or other message, triggering a text message, answering a phone call, creating a journal entry, and so forth. As described throughout, any type of user input or gesture may be used to trigger the functionality, such as swiping, tapping, or holding touch sensor 102. In one or more implementations, gesture manager 161 enables application developers or users to configure the types of user input or gestures that can be used to trigger various different types of functionalities.

At (832), method 820 can include initiating the functionality associated with the input gesture. For example, gesture manager 161 can cause a particular functionality to be performed, such as by obtaining data associated with an application and initiating an output response that provides an indication of the data, answering a phone call, creating a journal entry, increasing the volume on a television, turning on lights in the user's house, opening the automatic garage door of the user's house, and so forth. In this regard, the functionality can be initiated computing device it is local to the interactive object or remote from the interactive object. For example, interactive object can transmit to a remote computing device data indicative of the determined input gesture. In another example, the interactive object can initiate the functionality locally, for example by local computing device.

Returning to 826, if the touch input is not associated with the intended input surface of the touch sensor, method 820 proceeds at 834. At 834, method 820 can include determining that the touch input to the touch sensor was unintentional or should otherwise be ignored. For example, gesture manager 161 can take no action at 834 in some examples. In this manner, gesture manager 161 can automatically determine that the touch input is not indicative of a input gesture in response to determining that the touch input is associated with a second surface of the touch sensor.

Although not shown, method 820 can include determining a gesture associated with the second surface of the touch sensor and some examples. For instance, after determining that a second surface of the touch sensor is where touch input is received, gesture manager *can determine a gesture based on the touch data and the determination that the touch data is associated with the second surface of the touch sensor. Gesture manager can determine a particular gesture based on the identification that the touch input was not received at the intended input surface and some examples. A functionality associated with the gesture can be determined in the functionality initiated as earlier described.

Figure 18:
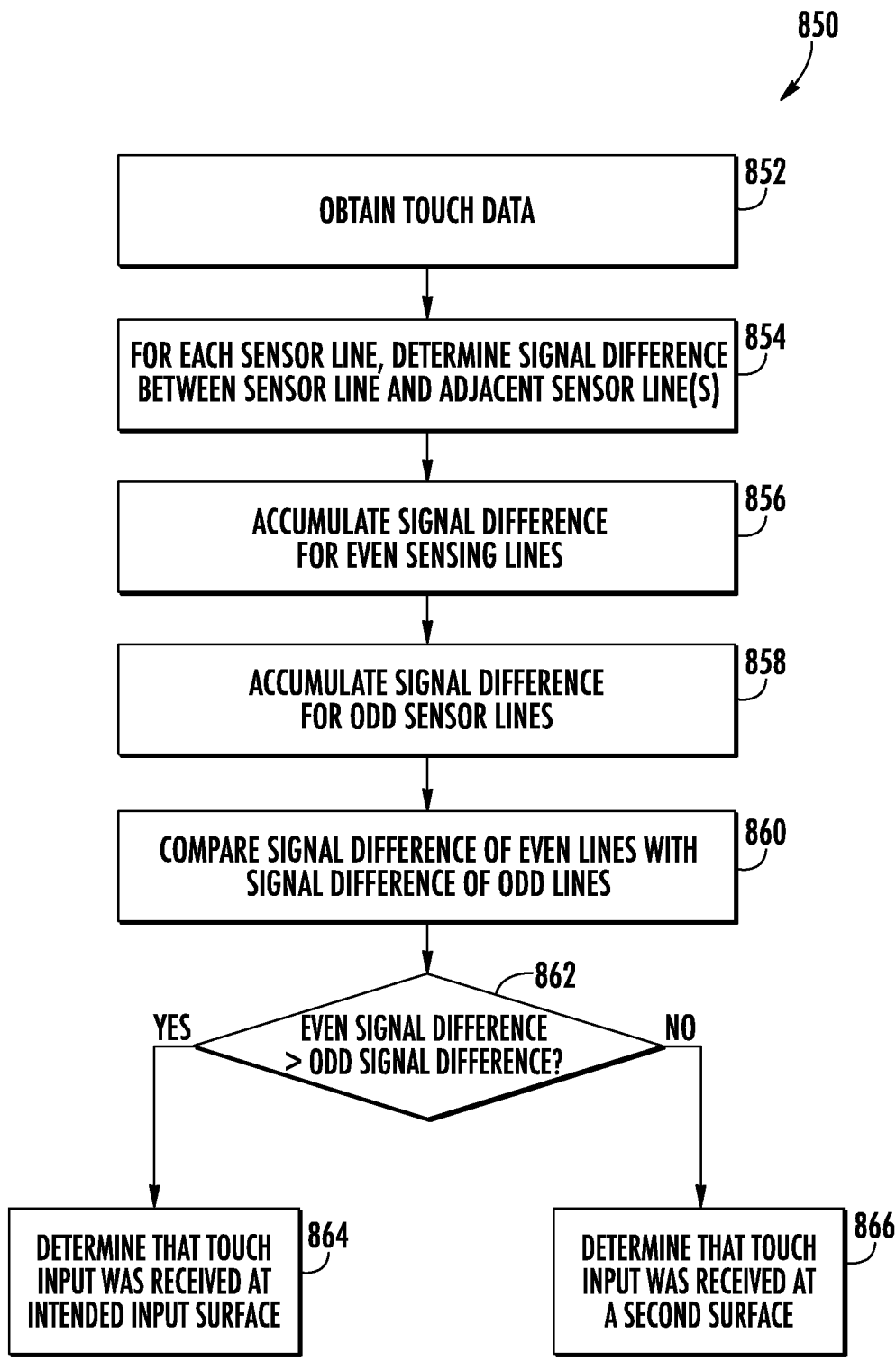
FIG. 18 is a flowchart depicting an example process of determining a surface at which a touch input is received based at least in part on a response of a set of sensing elements in accordance with example embodiments of the present disclosure.

FIG. 18 depicts a flowchart describing an example method of identifying a surface of a touch sensor at which a touch input is received based on a respective response of sensing elements of individuals subsets of the touch sensor in accordance with example embodiments of the present disclosure.

At 852, method 850 can include obtaining touch data. The touch data may indicate a respective response of each sensing element to a touch input. The touch data may indicate a capacitance or a resistance of each sensing element in response to the touch input.

At 854, method 850 can include determining, for each sensor element, a signal difference between the sensor element and one or more adjacent sensor elements. Gesture manager 161 can determine a difference in capacitance or resistance between a sensing element and its adjacent sensing elements in the lateral direction. By way of example, for each even sensing element of the touch sensor, a signal difference between the even sensing element and one or more odd sensing elements adjacent to the even sensing element in a lateral direction can be determined. Similarly, for each odd sensing element of the touch sensor, a signal difference between the odd sensing element and one or more even sensing elements adjacent in the lateral direction can be determined.

At 856, method 850 can include accumulating the signal difference of each even sensing element. For example, the signal difference of each even sensing element can be summed together to generate an accumulated signal difference for the subset of even sensing elements. In this regard, the accumulated signal difference for the even sensing elements can be based at least in part on two signal differences associated with at least two conductive sensing elements of the even subset.

At 858, method 850 can include accumulating the signal difference of each odd sensing element. For example, the signal difference of each odd sensing element can be summed together to generate an accumulated signal difference for the subset of odd sensing elements. In this regard, the accumulated signal difference for the odd sensing elements can be based at least in part on two signal differences associated with at least two conductive sensing elements of the even subset.

At 860, method 850 can include comparing the accumulated signal difference of the even subset of sensing elements with the accumulated signal difference of the odd subset of sensing elements. At 862, method 850 can include determining whether the accumulated signal difference for the even sensing elements is greater than the accumulated signal difference for the odd sensing elements. In some examples, gesture manager 161 can determine whether the difference between the even signal difference and the odd signal difference meets or exceeds a threshold. For example, gesture manager 161 can determine whether the even signal difference exceeds the odd signal difference by a threshold. If the even signal difference is greater than the odd signal difference, method 850 proceeds to 864. If the even signal difference is not greater than the odd signal different, method 850 proceeds to 866.

At 864, method 850 can include determining that the touch input was received at the intended input surface. At 866, method 850 can include determining that the touch input was received at a second surface of the touch sensor.

FIG. 19 depicts a block diagram of an example computing environment 900 that can be used to implement any type of computing device as described herein. The system environment includes a remote computing system 902, an interactive computing system 920, and a training computing system 940 that are communicatively coupled over a network 960. The interactive computing system 920 can be used to implement an interactive object in some examples.

The remote computing system 902 can include any type of computing device, such as, for example, a personal computing device (e.g., laptop or desktop), a mobile computing device (e.g., smartphone or tablet), a gaming console or controller, an embedded computing device, a server computing device, or any other type of computing device.

The remote computing system 902 includes one or more processors 904 and a memory 906. The one or more processors 904 can be any suitable processing device (e.g., a processor core, a microprocessor, an ASIC, a FPGA, a controller, a microcontroller, etc.) and can be one processor or a plurality of processors that are operatively connected. The memory 906 can include one or more non-transitory computer-readable storage mediums, such as RAM, ROM, EEPROM, EPROM, flash memory devices, magnetic disks, etc., and combinations thereof. The memory 906 can store data 908 and instructions 910 which are executed by the processor 904 to cause the remote computing system 902 to perform operations.

The remote computing system 902 can also include one or more input devices 912 that can be configured to receive user input. By way of example, the one or more input devices 912 can include one or more soft buttons, hard buttons, microphones, scanners, cameras, etc. configured to receive data from a user of the remote computing system 902. For example, the one or more input devices 912 can serve to implement a virtual keyboard and/or a virtual number pad. Other example user input devices 912 include a microphone, a traditional keyboard, or other means by which a user can provide user input.

The remote computing system 902 can also include one or more output devices 914 that can be configured to provide data to one or more users. By way of example, the one or more output device(s) 914 can include a user interface configured to display data to a user of the remote computing system 902. Other example output device(s) 914 include one or more visual, tactile, and/or audio devices configured to provide information to a user of the remote computing system 902.

The interactive computing system 920 can be used to implement any type of interactive object such as, for example, a wearable computing device. The interactive computing system 920 includes one or more processors 922 and a memory 924. The one or more processors 922 can be any suitable processing device (e.g., a processor core, a microprocessor, an ASIC, a FPGA, a controller, a microcontroller, etc.) and can be one processor or a plurality of processors that are operatively connected. The memory 924 can include one or more non-transitory computer-readable storage mediums, such as RAM, ROM, EEPROM, EPROM, flash memory devices, magnetic disks, etc., and combinations thereof. The memory 924 can store data 926 and instructions 928 which are executed by the processor 922 to cause the interactive computing system 920 to perform operations.

The interactive computing system 920 can also include one or more input devices 930 that can be configured to receive user input. For example, the user input device 930 can be a touch-sensitive component (e.g., a touch sensor 102) that is sensitive to the touch of a user input object (e.g., a finger or a stylus). As another example, the user input device 930 can be an inertial component (e.g., inertial measurement unit 158) that is sensitive to the movement of a user. Other example user input components include a microphone, a traditional keyboard, or other means by which a user can provide user input. The interactive computing system 920 can also include one or more output devices 932 configured to provide data to a user. For example, the one or more output devices 932 can include one or more visual, tactile, and/or audio devices configured to provide the information to a user of the interactive computing system 920.

The training computing system 940 includes one or more processors 942 and a memory 944. The one or more processors 942 can be any suitable processing device (e.g., a processor core, a microprocessor, an ASIC, a FPGA, a controller, a microcontroller, etc.) and can be one processor or a plurality of processors that are operatively connected. The memory 944 can include one or more non-transitory computer-readable storage mediums, such as RAM, ROM, EEPROM, EPROM, flash memory devices, magnetic disks, etc., and combinations thereof. The memory 944 can store data 946 and instructions 948 which are executed by the processor 942 to cause the training computing system 940 to perform operations. In some implementations, the training computing system 940 includes or is otherwise implemented by one or more server computing devices.

The training computing system 940 can include a model trainer 952 that trains a machine-learned classification model 950 using various training or learning techniques, such as, for example, backwards propagation of errors. In other examples as described herein, training computing system 940 can train machine-learned classification model 950 using training data 954. For example, the training data 954 can include labeled sensor data generated by interactive computing system 920. The training computing system 940 can receive the training data 954 from the interactive computing system 920, via network 960, and store the training data 954 at training computing system 940. The machine-learned classification model 950 can be stored at training computing system 940 for training and then deployed to remote computing system 902 and/or the interactive computing system 920. In some implementations, performing backwards propagation of errors can include performing truncated backpropagation through time. The model trainer 952 can perform a number of generalization techniques (e.g., weight decays, dropouts, etc.) to improve the generalization capability of the classification model 950.

In particular, the training data 954 can include a plurality of instances of sensor data, where each instance of sensor data has been labeled with ground truth inferences such as one or more predefined movement recognitions. For example, the label(s) for each instance of sensor data can describe the position and/or movement (e.g., velocity or acceleration) of an object movement. In some implementations, the labels can be manually applied to the training data by humans. In some implementations, the machine-learned classification model 950 can be trained using a loss function that measures a difference between a predicted inference and a ground-truth inference.

The model trainer 952 includes computer logic utilized to provide desired functionality. The model trainer 952 can be implemented in hardware, firmware, and/or software controlling a general purpose processor. For example, in some implementations, the model trainer 952 includes program files stored on a storage device, loaded into a memory and executed by one or more processors. In other implementations, the model trainer 952 includes one or more sets of computer-executable instructions that are stored in a tangible computer-readable storage medium such as RAM hard disk or optical or magnetic media.

In some examples, a training database 956 can be stored in memory on an interactive object, removable electronics module, user device, and/or a remote computing device. For example, in some embodiments, a training database 956 can be stored on one or more remote computing devices such as one or more remote servers. The machine-learned classification model 950 can be trained based on the training data in the training database 956. For example, the machine-learned classification model 950 can be learned using various training or learning techniques, such as, for example, backwards propagation of errors based on the training data from training database 956.

In this manner, the machine-learned classification model 950 can be trained to determine at least one of a plurality of predefined movement(s) associated with the interactive object based on movement data.

The machine-learned classification model 950 can be trained, via one or more machine learning techniques using training data. For example, the training data can include movement data previously collected by one or more interactive objects. By way of example, one or more interactive objects can generate sensor data based on one or more movements associated with the one or more interactive objects. The previously generated sensor data can be labeled to identify at least one predefined movement associated with the touch and/or the inertial input corresponding to the sensor data. The resulting training data can be collected and stored in a training database 956.

The network 960 can be any type of communications network, such as a local area network (e.g., intranet), wide area network (e.g., Internet), or some combination thereof and can include any number of wired or wireless links. In general, communication over the network 960 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

FIG. 16 illustrates one example computing system that can be used to implement the present disclosure. Other computing systems can be used as well. For example, in some implementations, the remote computing system 902 can include the model trainer 952 and the training data 954. In such implementations, the classification model 950 can be trained and used locally at the remote computing system 902. In some of such implementations, the remote computing system 902 can implement the model trainer 952 to personalize the classification model 950 based on user-specific movements.

The technology discussed herein makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, server processes discussed herein may be implemented using a single server or multiple servers working in combination. Databases and applications may be implemented on a single system or distributed across multiple systems. Distributed components may operate sequentially or in parallel.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A sensor system, comprising:
   a touch sensor comprising a plurality of conductive sensing elements integrated with a flexible substrate, the plurality of conductive sensing elements comprising a first subset of conductive sensing elements coupled to a first side of the flexible substrate and a second subset of conductive sensing elements coupled to a second side of the flexible substrate, wherein the first side is opposite the second side in a direction orthogonal to first side and the second side and each conductive sensing element of the plurality of conductive sensing elements is elongated in a first direction with a spacing between adjacent conductive sensing elements in a second direction orthogonal to the first direction, wherein each conductive sensing element of the first subset of conductive sensing elements is adjacent, in the second direction, to at least one conductive sensing element of the second subset of conductive sensing elements; and
   one or more control circuits configured to obtain touch data associated with a touch input to the touch sensor, the touch data indicative of a response to the touch input by at least one sensing element of the first subset of conductive sensing elements and a response to the touch input by at least one sensing element of the second subset of conductive sensing elements, wherein the one or more control circuits are configured to classify the touch input as associated with the first side of the flexible substrate or the second side of the flexible substrate based at least in part on a comparison of the response to the touch input by the at least one sensing element of the first subset of conductive sensing elements with the response to the touch input by the at least one sensing element of the second subset of conductive sensing elements;
   wherein the one or more control circuits are configured, in response to determining that the touch input is associated with the first side of the flexible substrate, to identify a gesture associated with the touch input based at least in part on the response to the touch input by the at least one sensing element of the second subset of conductive sensing elements.

2. The sensor system of claim 1, wherein the one or more control circuits are configured to:
   determine, in response to the touch input, a first respective response by a first conductive sensing element of the first subset and a second respective response by a second conductive sensing element of the second subset; and
   determine whether the touch data is indicative of a first input gesture based at least in part on the first respective response and the second respective response.

3. The sensor system of claim 2, wherein the one or more control circuits are configured to, in response to determining that the touch input is associated with the first side of the flexible substrate, determine whether the touch data corresponds to one or more pre-defined parameters associated with the first input gesture.

4. The sensor system of claim 3, wherein the one or more control circuits are configured to, in response to determining that the touch input is associated with the second side of the flexible substrate, determine that the touch input is not indicative of the first input gesture.

5. The sensor system of claim 4, wherein the one or more control circuits are configured to, in response to determining that the touch input is associated with the first side of the flexible substrate and that the touch data is indicative of the first input gesture, initiate, at a computing device, a functionality associated with the first input gesture.

6. The sensor system of claim 5, wherein the computing device is local to the sensor system.

7. The sensor system of claim 5, wherein the computing device is remote from the sensor system and initiating the functionality comprises transmitting to the computing device data indicative of the first input gesture.

8. The sensor system of claim 3, wherein determining whether the touch data corresponds to one or more pre-defined parameters associated with the first input gesture comprises providing the touch data as one or more inputs to one or more machine-learned models configured to generate one or more outputs indicative of whether the one or more inputs correspond to the first input gesture.

9. The sensor system of claim 8, wherein:
   the one or more machine-learned models are configured to classify the touch inputs as associated with the first side of the flexible substrate or the second side of the flexible substrate.

10. The sensor system of claim 9, wherein:
   the one or more machine-learned models are configured to generate the one or more outputs indicative of whether the one or more outputs correspond to the first input gesture based at least in part on whether the touch input is associated with the first side of the flexible substrate or the second side of the flexible substrate.

11. The sensor system of claim 1, wherein the one or more control circuits are configured to classify the touch input is as associated with the first side of the flexible substrate or the second side of the flexible substrate by:

determining at least one signal difference associated with the first subset of conductive sensing elements;

determining at least one signal difference associated with the second subset of conductive sensing elements;

determining that the touch input is associated with the first subset of conductive sensing elements if the at least one signal difference associated with the first subset of conductive sensing elements is greater than the at least one signal difference associated with the second subset of conductive sensing elements; and determining that the touch input is associated with the second subset of conductive sensing elements if the at least one signal difference associated with the second subset of conductive sensing elements is greater than the at least one signal difference associated with the first subset of conductive sensing elements.

12. The sensor system of claim 11, wherein:

the at least one signal difference associated with the first subset of conductive sensing elements is an accumulated signal difference based at least in part on two signal differences associated with at least two conductive sensing elements of the first subset; and the at least one signal difference associated with the second subset of conductive sensing elements is an accumulated signal difference based at least in part on two signal differences associated with at least two conductive sensing elements of the second subset.

13. The sensor system of claim 12, wherein:

a signal difference of a first conductive sensing element of the first subset is based at least in a part on a difference in signal between the first conductive sensing element and at least two adjacent conductive sensing elements of the second subset; and a signal difference of a second conductive sensing element of the second subset is based at least in a part on a difference in signal between the second conductive sensing element and at least two adjacent conductive sensing elements of the first subset.

14. The sensor system of claim 1, wherein:

the first subset of conductive sensing elements is separated from the second subset of conductive sensing elements in the direction orthogonal to the first side and the second side.

15. The sensor system of claim 14, wherein:

the sensor system is integrated with a wearable device;

the first side of the flexible substrate is adjacent to an intended input surface of the touch sensor; and the second side of the flexible substrate is adjacent to one or more portions of a body of a user when the wearable device is worn by a user.

16. The sensor system of claim 1, wherein:

the touch sensor is a capacitive touch sensor.

17. The sensor system of claim 1, wherein:

the first side of the flexible substrate and the second side are separated in the direction orthogonal to the first side and the second side; and the sensor system further comprises at least one additional layer positioned between the first side and the second side.

18. The sensor system of claim 1, wherein the one or more control circuits are configured to identify a gesture associated with the touch input based at least in part on the response to the touch input by the at least one sensing element of the first subset of conductive sensing elements and the response to the touch input by the at least one sensing element of the second subset of conductive sensing elements.

19. The sensor system of claim 1, wherein the one or more control circuits are configured to classify the touch input as associated with the first side of the flexible substrate if the response to the touch input by the at least one sensing element of the first subset of conductive sensing elements is greater than the response to the touch input by the at least one sensing element of the second subset of conductive sensing elements.

20. An interactive object wearable by a user, comprising:

a touch sensor comprising a plurality of parallel sensing lines elongated in a first direction with a separation therebetween in a second direction orthogonal to the first direction, the plurality of parallel sensing lines comprising a first subset of parallel sensing lines coupled to an input surface and a second subset of parallel sensing lines coupled to a second surface and separated in a third direction orthogonal to the first direction and the second direction, wherein the input surface is configured to receive inputs from the user and the second surface is adjacent to at least a portion of the user when the interactive object is worn by the user;

one or more control circuits in communication with the touch sensor, the one or more control circuits are configured to:

detect a touch input to the touch sensor and generate touch data indicative of a response to the touch input by at least one parallel sensing line of the first subset of parallel sensing lines and a response to the touch input by at least one parallel sensing line of the second subset of parallel sensing lines;

classify the touch input as associated with the input surface or the second surface based at least in part on a comparison of the response to the touch input by the at least one parallel sensing line of the first subset of parallel sensing lines with the response to the touch input by the at least one parallel sensing line of the second subset of parallel sensing lines; and in response to classifying the touch input as associated with the input surface, identify a gesture associated with the touch input based at least in part on the response to the touch input by the least one parallel sensing element of the second subset of parallel sensing lines.

21. A computer-implemented method of managing input at an interactive object, the method comprising:

obtaining, by one or more processors, touch data associated with a touch sensor comprising a plurality of parallel sensing lines elongated in a first direction with a separation therebetween in a second direction orthogonal to the first direction, the plurality of parallel sensing lines comprising a first subset of parallel sensing lines coupled to an input surface and a second subset of parallel sensing lines coupled to a second surface and separated in a third direction orthogonal to the first direction and the second direction, wherein the input surface is configured to receive input from a user and the second surface is adjacent to at least a portion of the user when the interactive object is worn by the user;

detecting, by the one or more processors, a touch input to the touch sensor;

generating, by the one or more processors, touch data indicative of a response to the touch input by at least one parallel sensing line of the first subset of parallel sensing lines and a response to the touch input by at least one parallel sensing line of the second subset of parallel sensing lines;

classifying, by the one or more processors, the touch input as associated with the input surface or the second surface based at least in part on a comparison of the response to the touch input by the at least one parallel sensing line of the first subset of parallel sensing lines with the response to the touch input by the at least one parallel sensing line of the second subset of parallel sensing lines; and in response to classifying the touch input as associated with the input surface, identifying a gesture associated with the touch input based at least in part on the response to the touch input by the least one parallel sensing element of the second subset of parallel sensing lines.

* * * * *

UNITED STATES PATENT AND TRADEMARK OFFICE
CERTIFICATE OF CORRECTION

| | |
|---|---|
| PATENT NO. | : 11,635,857 B2 |
| APPLICATION NO. | : 17/081322 |
| DATED | : April 25, 2023 |
| INVENTOR(S) | : Tong Wu |

It is certified that error appears in the above-identified patent and that said Letters Patent is hereby corrected as shown below:

On the Title Page

Under Item (65) please add Item (30) for Priority Details to include:
Oct. 28, 2019 (WO) ....................................PCT/US2019/058314

Signed and Sealed this
Thirteenth Day of August, 2024

Katherine Kelly Vidal
*Director of the United States Patent and Trademark Office*